US009398357B2

(12) United States Patent
Berkman et al.

(10) Patent No.: US 9,398,357 B2
(45) Date of Patent: Jul. 19, 2016

(54) AUDIO EQUIPPED FAN

(71) Applicant: Homewerks Worldwide, LLC, Lincolnshire, IL (US)

(72) Inventors: Peter D. Berkman, Highland Park, IL (US); Ruilin Zhang, Foshan (CN); Jeffrey Jon Pischke, Cary, IL (US); Michael Malaker, Gurnee, IL (US)

(73) Assignee: Homewerks Worldwide, LLC, Lincolnshire, IL (US)

( * ) Notice: Subject to any disclaimer, the term of this patent is extended or adjusted under 35 U.S.C. 154(b) by 0 days.

(21) Appl. No.: 14/467,828

(22) Filed: Aug. 25, 2014

(65) Prior Publication Data

US 2014/0360805 A1 Dec. 11, 2014

Related U.S. Application Data

(63) Continuation-in-part of application No. 14/286,071, filed on May 23, 2014, which is a continuation-in-part of application No. 14/043,581, filed on Oct. 1, 2013, now Pat. No. 8,763,750, said application No.

(Continued)

(51) Int. Cl.
*H05K 5/02* (2006.01)
*H04R 1/02* (2006.01)
*F24F 7/06* (2006.01)
*F21V 33/00* (2006.01)
*F24F 13/20* (2006.01)
(Continued)

(52) U.S. Cl.
CPC *H04R 1/02* (2013.01); *F24F 13/20* (2013.01); *H04R 1/028* (2013.01); *H04R 2201/021* (2013.01)

(58) Field of Classification Search
USPC .......... 181/150, 149, 199, 206; 454/248, 241; 362/364, 372, 249.02, 96
See application file for complete search history.

(56) References Cited

U.S. PATENT DOCUMENTS 1,532,635 A 4/1925 Osbun
2,010,322 A * 8/1935 Riddell ........................ 454/293
(Continued)

FOREIGN PATENT DOCUMENTS

CA 2471905 A1 7/2003
JP 4-20670 1/1992
(Continued)

OTHER PUBLICATIONS

United States District Court of Illinois Eastern Division, "Complaint for Patent Infringement," *Homewerks Worldwide, LLC* v. *Broan-Nutone LLC*, Case: 1:15-cv-01058, Document #1, filed Feb. 2, 2015, 32 pages.

(Continued)

*Primary Examiner* — Edgardo San Martin
(74) *Attorney, Agent, or Firm* — Cozen O'Connor

(57) ABSTRACT

An audio equipped fan is disclosed as having a housing, and a grille connected to the housing, and defining first openings through which air may flow while the fan is rotated, and second openings through which sound may travel. The fan also has an annular lighting array configured to selectively provide lighting in a high power or a low power configuration, and speakers connected to the grille and aligned on the interior side of the grille with the second openings of the grille so that sound may travel through the grille. Related methods are also disclosed.

20 Claims, 21 Drawing Sheets

Related U.S. Application Data

14/286,071 is a continuation-in-part of application No. 13/962,625, filed on Aug. 8, 2013.

(60) Provisional application No. 61/799,140, filed on Mar. 15, 2013, provisional application No. 61/745,560, filed on Dec. 22, 2012.

(51) Int. Cl.
*H05K 5/00* (2006.01)
*H04R 1/00* (2006.01)

(56) References Cited

U.S. PATENT DOCUMENTS 2,182,690 A 12/1939 Cole
2,189,008 A 2/1940 Kurth
2,278,581 A 4/1942 Dexter
2,359,021 A 9/1944 Campbell et al.
2,483,377 A 9/1949 Young
2,668,491 A 2/1954 Gerlitz
2,673,514 A 3/1954 Hanks
2,710,573 A 6/1955 Marker
2,800,069 A 7/1957 Smith
2,875,678 A 3/1959 Shepherd
D185,175 S 5/1959 Schlumbohm
2,911,900 A 11/1959 Rudy
2,924,661 A * 2/1960 Messeas, Jr. .................. 381/388
2,963,956 A 12/1960 Hill
2,966,550 A 12/1960 Golberg et al.
2,987,258 A 6/1961 North
3,002,676 A 10/1961 Papsdorf
3,045,579 A 7/1962 Jenn
3,064,548 A 11/1962 Field
3,068,341 A 12/1962 Ortiz
3,101,662 A 8/1963 Alldritt
3,194,952 A * 7/1965 Wells .............................. 362/86
3,211,080 A 10/1965 Rader
3,212,425 A 10/1965 Hazen
3,326,112 A 6/1967 Sadlow
3,332,334 A 7/1967 Melzer
3,347,025 A 10/1967 Wiley
3,438,180 A 4/1969 Klouda
3,572,234 A 3/1971 Schoenthaler
3,577,710 A 5/1971 Feldman
3,606,593 A 9/1971 Steiner
3,636,306 A 1/1972 Bumpus
3,665,838 A 5/1972 Shepherd
3,692,977 A 9/1972 Duhamel et al.
3,698,833 A 10/1972 Cann et al.
3,701,895 A 10/1972 Sweetser
3,732,030 A 5/1973 Mullings
3,743,439 A 7/1973 Cann
3,785,271 A 1/1974 Joy
3,788,207 A 1/1974 Doherty, II
3,832,679 A 8/1974 Foley et al.
3,926,537 A 12/1975 Piper
3,952,638 A 4/1976 Felter et al.
4,073,597 A 2/1978 Barnhart et al.
4,115,082 A 9/1978 Newell
4,142,227 A 2/1979 Aikens
4,252,547 A 2/1981 Johnson
D263,499 S 3/1982 Markowitz
4,319,898 A 3/1982 Maierhofer
4,322,632 A * 3/1982 Hart et al. ....................... 307/41
4,335,647 A 6/1982 Timmons
4,336,749 A 6/1982 Barnhart et al.
4,382,400 A * 5/1983 Stutzman .......................... 416/5
4,385,550 A 5/1983 Steiner et al.
4,385,911 A 5/1983 Popeil et al.
D270,559 S 9/1983 Clivio et al.
4,406,216 A 9/1983 Hott et al.
4,510,851 A 4/1985 Sarnosky et al.
D279,310 S 6/1985 Murphy
D287,276 S 12/1986 Little, Jr.
D287,888 S 1/1987 Castor et al.
D288,007 S 1/1987 Jonas et al.
4,671,284 A 6/1987 Wilson et al.
4,681,024 A 7/1987 Ivey
4,716,409 A * 12/1987 Hart et al. .................... 340/4.31
4,814,961 A 3/1989 O'Brien et al.
4,817,163 A * 3/1989 Stastny ......................... 381/150
4,867,640 A 9/1989 Penlesky et al.
D308,419 S 6/1990 Mason
5,058,490 A 10/1991 Sodec et al.
5,068,773 A 11/1991 Toth
D334,119 S 3/1993 Giugiaro
5,278,432 A 1/1994 Ignatius et al.
5,448,495 A * 9/1995 Liu .......................... 361/679.58
D372,775 S 8/1996 Schuler
D374,927 S 10/1996 Chabot
5,628,558 A 5/1997 Iacono et al.
5,664,872 A * 9/1997 Spearman et al. .............. 362/96
D386,244 S 11/1997 Caroen et al.
D387,859 S 12/1997 Ukai et al.
D390,757 S 2/1998 Wold et al.
D394,101 S 5/1998 Hayashi et al.
D403,787 S 1/1999 Van Belle
5,879,232 A 3/1999 Luter, II et al.
5,884,694 A * 3/1999 Tanenbaum .................. 165/125
5,909,534 A * 6/1999 Ko ............................... 392/376
5,918,972 A * 7/1999 Van Belle ..................... 362/480
5,934,783 A * 8/1999 Yoshikawa ...................... 362/96
5,938,525 A 8/1999 Birdsong et al.
5,980,057 A * 11/1999 Christie .......................... 362/86
6,060,979 A 5/2000 Eichsteadt
6,087,938 A 7/2000 Gitelis et al.
D437,194 S 2/2001 Rivas et al.
6,215,885 B1 * 4/2001 Geiger .......................... 381/386
D444,777 S 7/2001 Bird et al.
6,321,869 B1 * 11/2001 Park ............................. 181/199
D453,375 S 2/2002 Peng
6,345,685 B1 2/2002 Wells et al.
D454,392 S 3/2002 Shapiro
6,361,432 B1 3/2002 Walker
D457,232 S 5/2002 Miura
D457,616 S 5/2002 Yamanaka et al.
D461,236 S 8/2002 Chura et al.
6,488,579 B2 12/2002 Larson et al.
6,494,599 B1 12/2002 Leen
6,558,003 B2 5/2003 Mihara
6,601,247 B2 8/2003 Shimizu
6,634,768 B2 10/2003 McKenzie et al.
D490,147 S 5/2004 Miura
6,769,509 B2 8/2004 Harwood
D510,996 S 10/2005 Vladika
6,979,169 B2 12/2005 Penlesky et al.
D521,145 S 5/2006 Craw et al.
7,066,613 B2 6/2006 Vishwamitra
D531,301 S 10/2006 Sinur et al.
D533,956 S 12/2006 Vladika
D535,431 S 1/2007 Roland
D535,433 S 1/2007 Craw et al.
D540,619 S 4/2007 Kim
D543,270 S 5/2007 Miura et al.
D555,777 S 11/2007 Aveldson et al.
D556,855 S 12/2007 Mullenmeister et al.
D559,948 S 1/2008 Bickler et al.
D559,953 S 1/2008 Bickler et al.
D562,937 S 2/2008 Schonherr et al.
D565,716 S 4/2008 Jacak
D565,717 S 4/2008 Jacak et al.
D565,722 S 4/2008 Hollingsworth et al.
D566,262 S 4/2008 Zakula et al.
D567,352 S 4/2008 Hollingsworth et al.
D567,353 S 4/2008 Hollingsworth et al.
D567,354 S 4/2008 Jacak et al.
D567,355 S 4/2008 Zakula et al.
D567,597 S 4/2008 Shamoon
D567,931 S 4/2008 Hollingsworth et al.
D567,932 S 4/2008 Hollingsworth et al.
D567,933 S 4/2008 Hollingsworth et al.
D568,460 S 5/2008 Jacak et al.
D569,492 S 5/2008 Zakula et al.
D570,465 S 6/2008 Miyake et al.

(56) References Cited

U.S. PATENT DOCUMENTS 7,380,292 B1 6/2008 Harris
D574,478 S 8/2008 Miyake et al.
D575,386 S 8/2008 Jacak et al.
D575,387 S 8/2008 Zakula et al.
D577,805 S 9/2008 Adrian et al.
D581,508 S 11/2008 Miyake et al.
D581,517 S 11/2008 Koury et al.
7,455,500 B2 11/2008 Penlesky et al.
7,455,583 B2 11/2008 Taya
7,467,881 B2 * 12/2008 McMillen ..................... 362/364
D584,111 S 1/2009 Eide et al.
D584,393 S 1/2009 Miyake et al.
D584,394 S 1/2009 Miyake et al.
D585,975 S 2/2009 Guthrie
D586,455 S 2/2009 Guthrie
D586,456 S 2/2009 Guthrie
7,553,039 B2 * 6/2009 Harris et al. .................. 362/101
7,606,379 B2 * 10/2009 Ivey et al. ..................... 381/160
7,607,935 B2 * 10/2009 Dahl ............................. 439/485
7,683,777 B2 3/2010 Macaluso et al.
D618,782 S 6/2010 Zakula et al.
D623,265 S 9/2010 Reynoso
D623,721 S 9/2010 Reynoso
7,844,060 B2 * 11/2010 Zulkowski ...................... 381/87
D630,706 S 1/2011 Giggs et al.
7,862,194 B2 1/2011 Seade
7,881,565 B2 2/2011 Kilic et al.
7,881,656 B2 * 2/2011 Khedouri et al. ............ 455/3.01
D635,238 S 3/2011 Zakula et al.
D639,385 S 6/2011 Flowers et al.
8,042,961 B2 * 10/2011 Massara et al. ................. 362/86
D653,323 S 1/2012 Jacak et al.
D654,998 S 2/2012 Zakula et al.
D655,403 S 3/2012 Zakula et al.
D664,249 S 7/2012 Wang et al.
8,218,805 B2 * 7/2012 Hornback ..................... 381/333
D665,478 S 8/2012 Farley
8,297,402 B2 * 10/2012 Stewart et al. ................ 181/152
8,300,869 B2 * 10/2012 Marlin et al. ................. 381/340
8,365,861 B2 * 2/2013 Massini et al. ................ 181/206
8,382,332 B2 2/2013 Zakula et al.
D678,468 S 3/2013 Hanna
D678,995 S 3/2013 Hoshino et al.
D681,794 S 5/2013 Lin et al.
8,434,916 B2 * 5/2013 Craw et al. .................... 362/373
8,485,696 B2 * 7/2013 Pringle et al. ................. 362/373
8,666,104 B2 * 3/2014 Ivey et al. ..................... 381/340
8,763,750 B1 * 7/2014 Berkman et al. .............. 181/150
8,814,513 B2 * 8/2014 Yang et al. ........................ 416/5
8,967,832 B2 3/2015 Zakula et al.
9,004,723 B2 4/2015 Zakula et al.
2003/0031330 A1 * 2/2003 Kim .............................. 381/111
2004/0107271 A1 6/2004 Ahn et al.
2004/0179710 A1 9/2004 Farinelli et al.
2005/0186993 A1 8/2005 Yueh
2005/0286546 A1 12/2005 Bassoli et al.
2006/0072776 A1 4/2006 Vishwamitra
2006/0262949 A1 11/2006 Cho et al.
2007/0008711 A1 * 1/2007 Kim ................................ 362/86
2007/0064433 A1 * 3/2007 Wright .......................... 362/364
2007/0092088 A1 4/2007 Chang
2007/0259617 A1 11/2007 Craig
2008/0069686 A1 3/2008 Masaki et al.
2008/0109550 A1 5/2008 Tedesco et al.
2008/0182505 A1 7/2008 Oosterhuis
2008/0225510 A1 * 9/2008 Rocha ............................ 362/86
2008/0226112 A1 9/2008 Lin
2008/0298045 A1 * 12/2008 Wright ............................ 362/86
2009/0061757 A1 3/2009 Rimmer et al.
2009/0170421 A1 7/2009 Adrian et al.
2009/0196016 A1 * 8/2009 Massara et al. ................. 362/86
2010/0009621 A1 * 1/2010 Hsieh ............................ 454/293
2010/0127607 A1 5/2010 Harris
2010/0190607 A1 7/2010 Widerman et al.
2010/0199413 A1 8/2010 Pollack et al.
2010/0308657 A1 * 12/2010 Bucher ........................... 307/41
2011/0047686 A1 3/2011 Moore
2011/0080733 A1 * 4/2011 Wang ............................ 362/253
2011/0230116 A1 * 9/2011 Balik ............................ 446/397
2011/0248835 A1 10/2011 Speegle et al.
2011/0306299 A1 12/2011 Wells
2011/0317861 A1 * 12/2011 Haase ........................... 381/333
2012/0039483 A1 2/2012 Burke et al.
2012/0087125 A1 4/2012 Liu
2012/0087128 A1 * 4/2012 Zakula et al. ............ 362/249.02
2012/0171942 A1 * 7/2012 Herzer .......................... 454/152
2013/0062437 A1 3/2013 Hanna et al.
2013/0084793 A1 * 4/2013 Yang et al. .................... 454/248
2014/0053793 A1 2/2014 Sullivan et al.
2014/0099195 A1 4/2014 Jun
2014/0192513 A1 * 7/2014 Yim et al. ....................... 362/86
2014/0254857 A1 9/2014 Berkman et al.
2014/0268650 A1 9/2014 Tsai

FOREIGN PATENT DOCUMENTS

JP 4-49381 2/1992
JP 2001157642 A 6/2001
JP 2004301438 A 10/2004
JP 2008164206 A 7/2008
JP 2008190766 A 8/2008
JP 05119784 B2 1/2013
JP 5-230853 B2 7/2013

OTHER PUBLICATIONS

Apr. 28, 2015—(US) Non-Final Office Action—U.S. Appl. No. 29/475,728.

www.ferguson.com, Bathroom Fans, Oct. 22, 2013, 12 pp.

Jul. 22, 2015—(US) Notice of Allowance—U.S. Appl. No. 29/475,728.

* cited by examiner

AUDIO EQUIPPED FAN

CROSS-REFERENCE TO RELATED APPLICATIONS

This is a continuation-in-part of application Ser. No. 14/286,071, filed May 23, 2014 which is a continuation-in-part of application Ser. No. 14/043,581, filed Oct. 1, 2013 and issued as U.S. Pat. No. 8,763,750 on Jul. 1, 2014, and of application Ser. No. 13/962,625, filed Aug. 8, 2013, both of which claim priority to Application No. 61/799,140, filed Mar. 15, 2013, and Application No. 61/745,560, filed Dec. 22, 2012. The above applications are incorporated by reference, and priority is claimed thereto.

FIELD

The invention relates generally to audio systems, and more particularly to audio equipped fans and network enabled fans.

BACKGROUND

Numerous types of speaker systems are available for providing music and other audio content in homes, business and other settings. Known speaker systems that are well-suited for use in certain areas can be unsuitable for use in other areas due to a wide variety of factors such as, for example, space limitations, lack of convenient access to a source of electrical power, potential exposure to high humidity, difficulties associated with mounting the speakers, or esthetic issues with power cords and/or connecting cords that transmit audio signals to the speakers. Use of battery-powered speakers can eliminate the need for power cords, but can be inconvenient due to the fact that batteries require periodic replacement or recharging, and due to the fact that speaker systems will cease to function unexpectedly if batteries become discharged. In-wall mounting of speakers can also address some of the concerns relating to space limitations and esthetics, but the expense of in-wall mounting can be significant, particularly if wiring is to be run through the walls to power the speakers and/or provide audio signals. Also, mounting of speakers in a wall that is shared by two rooms with the intention of providing music or other audio content in one room only can sometimes undesirably lead to propagation of sound to adjoining rooms beyond acceptable levels.

Use of Bluetooth technology and other wireless technology can of course eliminate the need for wired connections to transmit audio signals, but the audio quality may suffer in areas where electronic interference may be present. From the standpoint of the listener, audio quality can also be affected significantly by factors such as speaker placement, obstacles or lack of obstacles between the listener and the speaker, acoustics of the room in which the speakers are placed, background noise, and speaker volume or loudness.

One of the more difficult challenges in providing high-quality audio in homes, businesses, and other settings relates to provision of music and other audio content in bathrooms, where factors such as acoustics, fan noise, shower noise, moisture and humidity can be particularly problematic. There is a need for improvements in sound systems that can address the problems associated with these factors, and in methods of manufacturing and installing such systems.

Figure 1A:
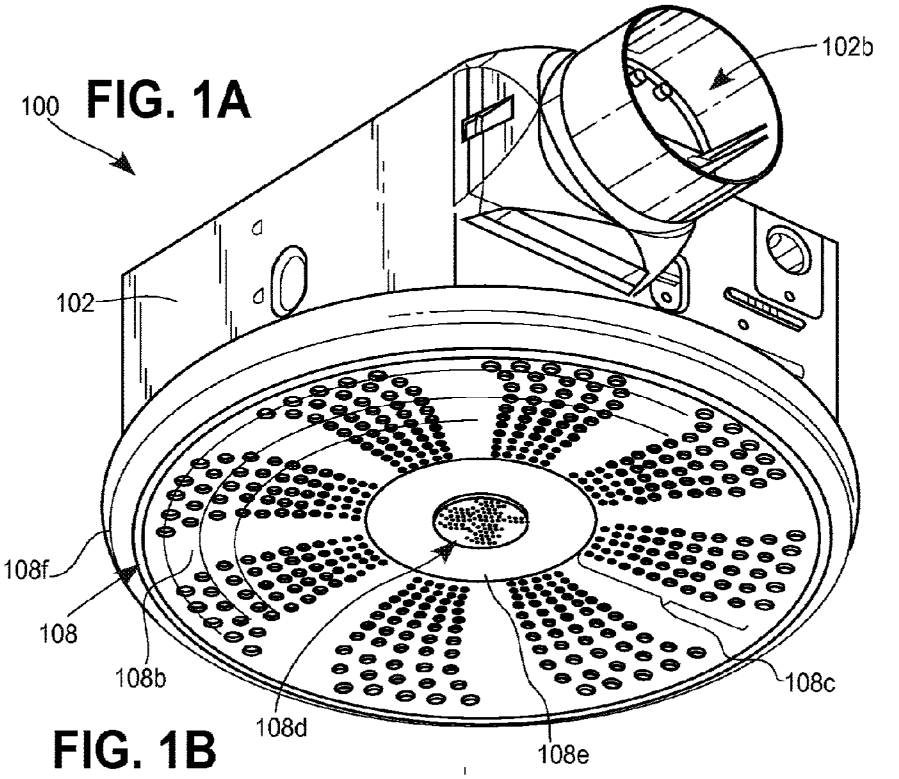
FIGS. 1A-D are perspective, bottom, side and rear views, respectively, of an exemplary fan embodiment, with FIG. 1C being partially in section so that internal components are visible.

Corresponding reference characters indicate corresponding components throughout the several views of the drawings. Elements in the figures are illustrated for simplicity and clarity and have not necessarily been drawn to scale. For example, the dimensions of some of the elements in the figures may be exaggerated relative to other elements to help to improve understanding of various embodiments. Also, common but well-understood elements that are useful or necessary in a commercially feasible embodiment are often not depicted in order to facilitate a less obstructed view of the illustrated elements.

DETAILED DESCRIPTION

The following description is not to be taken in a limiting sense, but is made merely for the purpose of describing exemplary embodiments. Reference throughout this specification to “one embodiment”, “an embodiment”, “some embodiments”, “one form”, or similar language means that a particular feature, structure, or characteristic described in connection with the embodiment is included in at least one embodiment of the present invention. Thus, appearances of the phrases “in one embodiment,” “in an embodiment,” “some embodiments”, “in one form”, “in another form”, and similar language throughout this specification may refer to the same embodiment and/or may refer to separate or alternate embodiments as well. Furthermore, the described features, structures, or characteristics of the invention may be combined in any suitable manner in one or more embodiments.

FIGS. 1A-D illustrate an audio equipped fan assembly 100 which includes a housing 102 having an opening at its bottom to define an air inlet 102*a*. The housing may be made of metal, such as aluminum, and has a generally rectangular body with a circular outlet duct member 102*b* sized to connect with conventional ductwork.

Motor 104 is disposed at least partially within the housing 102 and is positioned in a vertical orientation with the motor output shaft 104*a* extending vertically down toward the housing inlet 102*a* and aligned along a central axis of the inlet opening 102*a*. In the form illustrated, the motor 104 is only partially disposed within housing 102 and, more particularly, only a lower portion of the motor including the motor output shaft 102*a* is within the housing 102 while the remainder of the motor 104 is within a housing cap member 102*d*. In alternate embodiments the motor 104 could alternatively be mounted entirely within the housing 102 if desired.

A centrifugal impeller 106 is connected directly to the output shaft 104*a* of motor 104 and is rotated by the output shaft 104*a* to pull air into the inlet 102*a*, through the housing interior 102*c* and out of the exhaust fan 100 via outlet 102*b*. The centrifugal fan 106 will pump a constant volume of air (constant CFM) through the fan housing at a constant fan speed and allows for quite operation (e.g., 2.0 Sones or less). In other embodiments different types of fans, such as axial-flow fans, scroll fans, or cross-flow fans may be used. Impellers and other components could be positioned or located outside of the housing 102.

A grille 108 is connected to the bottom of the housing and positioned in axial alignment with the impeller. The grille has an interior side 108*a* and an exterior side 108*b*, and defines a first array of openings 108*c* through which air may flow upward while the fan is operated and a second array of openings 108*d* through which sound may propagate downward. In the form illustrated, the openings 108*c*, 108*d* are in a swirl pattern, with the first openings decreasing in size or diameter toward the center of grille 108. The openings 108*d* in the second array are smaller in size or diameter than the smallest openings of the first array 108*c*. The smaller size of second openings 108*d* may help to prevent moisture from reaching the speaker 110 as air flow will find less resistance in passing through the larger openings of the first array of openings 108*c*.

In alternate forms, it should be understood that the first and second openings 108*c*, 108*d* may be provided in similar shapes and sizes. In the form illustrated in FIGS. 1A-D, a border, such as a solid, unperforated annular region 108*e* is provided between the first and second openings 108*c*, 108*d*. In other forms, a particular pattern can make a seamless transition from the first openings 108*c* to the second openings 108*d*.

Figure 1B:
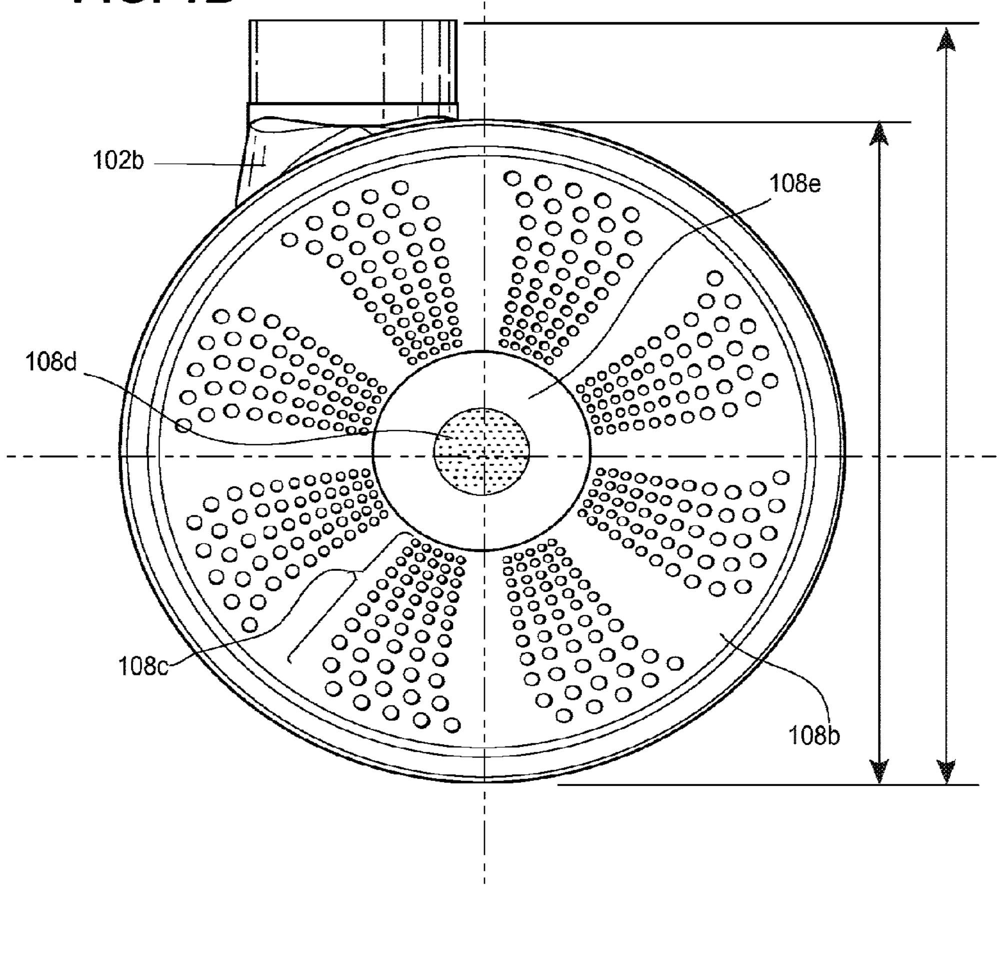
Figure 1C:
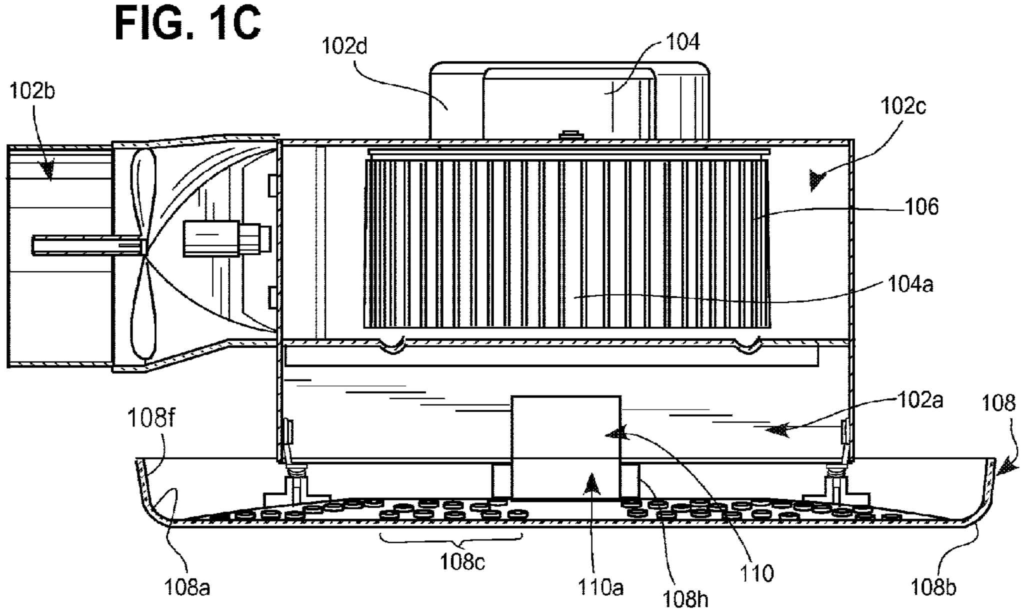
Figure 1D:
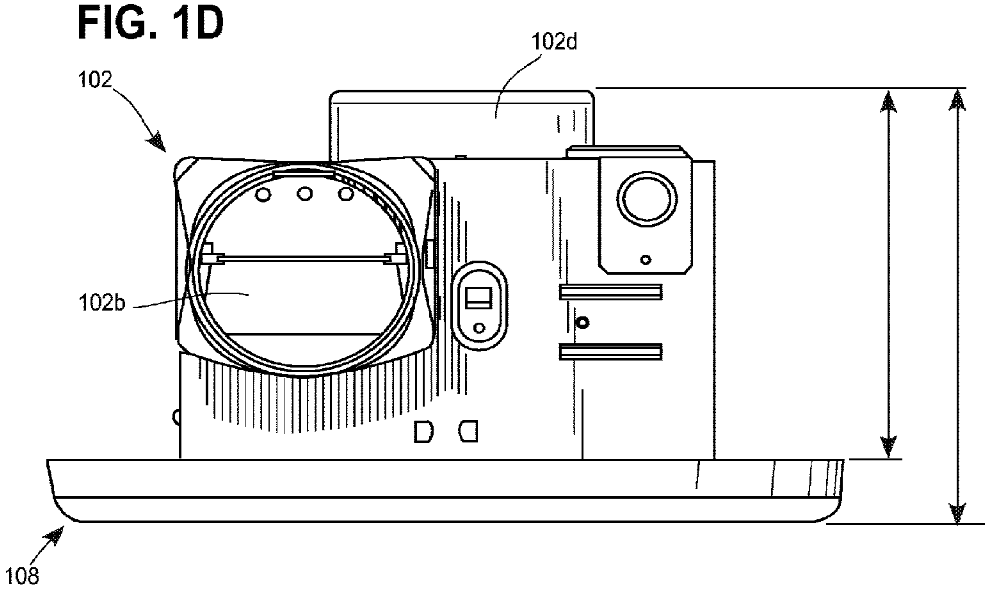

As is best illustrated in FIG. 1C, the grille 108 has a shallow dish shape with an upstanding outer annular wall 108*f* located at its perimeter and a slightly concave lower surface in which openings 108*c* are disposed. The annular wall 108*f* is angled upward and outward and is rounded to assist with molding and includes guides which are used to center and align the grille 108 during installation across housing inlet 102*a*. In a preferred form, and as best illustrated in FIG. 1B, the grille 108 has an outer diameter that is sufficient to cover housing 102 with the exception of a small portion of the round outlet duct 102*c*. This allows the housing 102 to be hidden easily in a ceiling and allows only the more decorative grille 108 to remain visible once the fan 100 is installed.

In the form illustrated, speaker 110 is connected to the grille 108 and positioned along a central axis of the grille so that air may flow around the speaker 110 and through the fan 106 and fan housing 102 without interruption. This also allows sound to downwardly propagate from the speaker 110 located on the interior side 108*a* of the grille 108, through the second openings 108*d* to the exterior side 108*b* of the grille 108 and into the room above which the fan 100 is installed. More particularly, in the form illustrated, the grille 108 includes a mount 108*h* for mounting the speaker in alignment with the second array of openings 108(*d*). The mount 108*h* preferably includes a first mating structure that mates with a second mating structure found on the speaker 110. In this form, the mating structures are the outer annular wall of the speaker 110 and the annular wall of the grille mount 108*h* which mate with one another via a friction fitting.

To help reduce fan noise and thereby enhance the audio quality associated with the system, the speaker is positioned directly beneath the fan motor and the axis of the impeller, and thus blocks some of the noise associated with the fan. This placement also has the benefit of minimizing or at least reducing distance between the speaker and the listener. In addition, the number and size of openings 108*e* and the material and configuration of the grille are preferably selected so that the grille reduces fan noise significantly, particularly in upper frequency ranges, without unduly restricting airflow. To this end, the grille 108 is preferably made of a nonmetallic material having sound-damping properties, and the diameter of the grille 108 is preferably greater than the diameter of the impeller 106. The grille diameter provides an outer region of the grille 108 that permits airflow into the fan through openings that are farther from the source of fan noise, thus helping to attenuate fan noise in the room and enhance audio quality.

In the form illustrated, speaker 110 has a generally circular-cylindrical side wall 110*a* and the grille mount 108*h* includes an annular wall 108*a* extending up from the interior side 108*a* of the grille 108 that is sized to receive the round housing portion 110*a* of speaker 110. More particularly, in the form illustrated, the round housing portion 110*a* of speaker 110 has a first diameter and the annular wall of the grille mount 110*h* defines an opening with a second diameter with the second diameter being slightly larger than the first diameter so that at least a portion of the round housing portion 110*a* of the speaker 110 may be disposed in the annular wall of the grille when the speaker 110 is connected to the grille 108. In this way, the annular wall 108*h* of grille 108 forms a sleeve within which a portion of the rounded speaker housing portion 110*a* is disposed. The speaker 110 may be fastened to the mount 108*h* if desired, such as by a screw, bolt, rivet, adhesive, or other means, or may simply be held in place by friction and/or gravity.

Although the embodiment illustrated shows the sleeve 108*h* receiving less than a quarter of the speaker 110, it should be understood that in alternate embodiments the sleeve 108*h* may receive more or less of the speaker 110 simply by adjusting the height of the mount wall 108*h*. Similarly, it should be understood that in alternate forms, the speaker 110 make take on different shapes and sizes. So too may the mount 108*h* take on different shapes and sizes so that a mating relationship may be made between the mount 108*h* and the speaker 110. For example, in some forms, the mating relationship between the speaker and the mount 108*h* may be designed as a friction fit or snap fit so that the speaker 110 snaps into the grille mount 108*h* to secure the speaker 110 to the grille 108. For example, as will be discussed further below, the speaker 110 and mount 108*h* may be designed with a combination of hooks and mating recesses or depressions which allow the speaker 110 to be securely attached to or fastened to the grille 108.

Turning back to FIGS. 1A-D, in this form, the speaker 110 has a round housing portion with a first outer diameter and the second openings 108*d* of the grille 108 are positioned about a central axis of the grille 108 in a circular pattern having a second diameter that is generally or approximately equal in size to the first diameter so that the speaker openings 108*d* match the footprint of the speaker 110. In an alternate form, however, the second diameter that defines the bounds of the second openings 108*d* may be made larger than the first diameter of speaker 110 so that the footprint of the speaker 110 is smaller in size than the spread or bounds of the second speaker openings 108*d*.

Although the speaker 110 has been discussed thus far as being connected to the grille 108, it should be understood that in alternate forms the speaker 110 may be connected to at least one of the housing 102, motor 104, fan 106 and grille 108. Preferably such connections will align the speaker 110 on the interior side 108*a* of the grille 108 with the second openings 108*d* of the grille so that sound may travel from the speaker 110 through the grille 108. In these alternate embodiments, as with the embodiment of FIGS. 1A-D, the first and second openings 108*c*, 108*d* may maintain similar shapes or patterns over the grille 108. For example, the first openings 108*c* may decrease in size from an outer perimeter or circumference of the grille 108 to a center or central axis of the grille 108 and the second openings 108*d* may maintain this pattern by either being smaller in size than any of the first openings 108*c* or by decreasing in size themselves from an outer perimeter or circumference of the second array of openings 108*d* to the center or central axis of the grille 108. Alternatively, as mentioned above, the first and second openings 108*c*, 108*d* may have distinct shapes or patterns so that the first and second openings 108*c*, 108*d* can easily be distinguished from one another. The grille 108 may further define a border region 108*d* between the first and second openings to distinguish the first and second openings 108*c*, 108*d* from one another.

Turning back to FIGS. 1A-D, the speaker 110 and motor 104 share a common power source. In this form, the power source is an AC power supply such as a 110-240V, 50-60 Hz power supply. In a preferred form, the speaker will be wired so that it remains constantly powered or constantly on so that the speaker can be used to transmit sound regardless of whether power is being supplied to the fan or regardless of whether the fan is being operated or turned on. Thus, in this embodiment the speaker 110 is hard-wired into the fan assembly 100.

In alternate forms, the speaker 110 and motor 104 may be powered via separate or different power sources. For example, in one form the speaker 110 is battery operated and the motor 104 is powered via an AC power source. In such an embodiment a dry cell battery may be used to power the Bluetooth speaker. In order to conserve battery life, the speaker 110 may be set up to switch on with the motor, but may shut off within a predetermined amount of time should no operating signal or pairing be made between the Bluetooth speaker and an electronic device, such as a mobile or hand held device, e.g., a phone, MP3 player or other music player, laptop, tablet or other computer, etc. In a preferred form, the predetermined time will be any one of one, two, five, ten, fifteen or twenty minutes depending on the application or place and type of fan and/or battery used. Preferably the speaker will be of the mini Bluetooth type having an signal to noise ratio (SNR) greater or equal to 75 DB, and an IP44 rating to withstand the humidity that the speaker 110 may be exposed to if installed in a bathroom with shower or tub.

In the form illustrated in FIGS. 1A-D, the audio equipped fan assembly is network enabled or capable of being connecting into a network with one or more electronic devices. For example, when used with a Bluetooth speaker, the speaker can be paired with multiple electronic devices to form a local area network (LAN). For example, a smart phone equipped with a Bluetooth transmitter may be used to play music over the speaker 110 of the fan assembly 100. The speaker fan assembly may itself be equipped with a Bluetooth transceiver and microphone (mic) and therefore allow two-way communications to take place between the speaker 110 and the electronic device. Thus, a user may not only be able to play music over the speaker 110 from a remote electronic device, but may also be able to conduct a telephone call or other telecommunications via the fan assembly 100. The electronic device could be a telephone, a tablet or netbook computer, or it may be a component that is part of a home or business communication system such as an intercom system. In other embodiments, the fan assembly 100 may be configured to handle only one-way communications. Similarly, although Bluetooth is discussed in the above examples, it should be understood that the assembly may be set up using other industry standards for radio or infrared communication.

Turning back to the embodiment of FIGS. 1A-D, the audio equipped fan assembly may further include a remotely controllable actuator or actuator spaced apart from the assembly 100 for turning on and off the fan or speaker. The actuator could simply be a single actuator used to turn on and off both the fan 106 and speaker 110 at the same time. In another form, the actuator could include a first actuator for turning on and off the fan and a second actuator, separate from the first actuator, for turning on and off the speaker so that the fan and speaker may be operated independent of one another. In yet another form, the assembly 100 may include a controller connected to the actuator for detecting power line communication (PLC) via toggling of the actuator on and off. Toggling of the actuator on and off a first number of times may instruct the controller to turn on both the fan and the speaker. Toggling the actuator on and off a second number of times may instruct the controller to turn on the speaker only and not the fan. PLC actuation is discussed in expired U.S. Pat. No. 4,716,409 issued to Hart et al. on Dec. 29, 1987, expired U.S. Pat. No. 4,322,632 issued to Hart et al. on Mar. 30, 1982 and in published U.S. Patent Application No. 2011/0148508 A1, published to Liu et al. on Jun. 23, 2011, the disclosures of which are incorporated herein by reference. In still other forms and as will be discussed below, these actuators may operate manually or automatically. For example, a motion detector actuator may be used to detect a person's presence and automatically activate the speaker 110 (at least for some time) while the person is present. If no signal or pairing is made with the speaker in a predetermined amount of time, it may again turn off. Then after a predetermined amount of time has passed, the speaker may automatically turn back on once a person's presence is detected.

As mentioned above, the assembly 100 preferably will seal the speaker to minimize, reduce or prevent exposure of the speaker to moisture. More particularly, the speaker, transceiver and/or microphone may also be sealed to prevent or reduce exposure to moisture. In one form, the seal comprises a cover made of a water-impermeable, moisture-resistant or mesh or screen material over the speaker that is permeable to sound but impermeable or less permeable to moisture. In addition, a seal such as an 0-ring may be used to seal the speaker to a portion of the fan assembly.

In the form illustrated in FIGS. 1A-D, the audio equipped fan assembly 100 is configured such that the speaker 110 is positioned below the motor 104 and fan 106 and arranged to propagate sound waves downward and avoid excessive transmission of sound waves upward. This helps reduce noise that the assembly 100 might otherwise make. For example, in applications where the fan 100 is mounted in the ceiling of a room, it is likely desirable to prevent the music or other audio coming from speaker 110 from travelling up or out to the sides to other rooms in the building structure. In the form illustrated, the grille 108, speaker 110, motor 104 and fan 106 are aligned along a common central axis with the speaker 110 located below the motor 104 and fan 106 so that the insulation used to contain or dampen noise generated from these devices can also be used to help contain or dampen unwanted noise generated by speaker 110.

In the form illustrated in FIGS. 1A-D, the grille 108 includes a first region above second openings 108*d* that permits downward propagation of sound waves while restricting admission of moisture into the speaker 110 or a speaker interior space, and a second region above first openings 108*e* that permits admission of moisture into and through the inner cavity 102*c* of the fan housing 102 or fan interior space while decreasing fan noise beneath the fan assembly 100. In a preferred form, at least one of the fan 106, motor 104 and speaker 110 or electrical wiring connecting these components to a power source is shielded to avoid the fan 106 and motor 104 from interfering with the speaker 110 and the transmission of sound from the speaker 110. For example, in one form the motor 104 and wiring connecting the motor to a power source are electrically isolated from the speaker 110 and speaker wiring to avoid motor interference with the speaker or noise on the power line from interfering with the performance of speaker 110. In another form, the motor 104 and wiring connecting the motor to a power source is shielded from the transceiver associated with the speaker 110 to prevent the motor 104 from interfering with signals transmitted to and/or from the transceiver and/or audio produced by the speaker 110 and/or audio received by the microphone.

In ceiling mounted applications like those discussed above, audio equipped fan 100 may also include insulation positioned within the housing to prevent or dampen upward or sideways propagation of sound waves from the fan assembly such as the noise discussed above. This insulation may consist of the fan housing 102 itself, or it may include additional items such as insulation of any type (e.g., foam insulation, etc.) which is used to line inner or outer surfaces of the housing 102 or inner or outer surfaces of the other components of the fan assembly (e.g., motor 104, fan 106, etc.). Additional insulation may be packed around the fan assembly 100 to further reduce the risk of unwanted noise propagating out of the intended area (e.g., noise propagating to neighboring rooms, etc.).

Although the embodiments illustrated herein disclose a fan only fan assembly, it should be understood that in alternate forms the fan assembly may include other conventional features such as a light and/or a heat lamp. For example, the fan assembly 100 may alternatively include a light connected to the audio equipped fan assembly on the interior side 108*a* of grille 108 wherein the grille further includes a light-transmissive member to illuminate an area on the exterior side 108*b* of grille 108, and having an actuator for turning on and off one or more of the fan, speaker and light. In preferred forms, a fan assembly 100 will be provided in 50 CFM, 60 CFM, 70 CFM, 80 CFM, 90 CFM, 100 CFM, 110 CFM, 120 CFM, 130 CFM, 140 CFM and 150 CFM models with and without lights, ranging in noise level between 0.75-2.0 Sones, and use a Bluetooth speaker operating on a frequency between 160 Hz-20 KHz with a SNR greater than 90 DB.

Figure 2A:
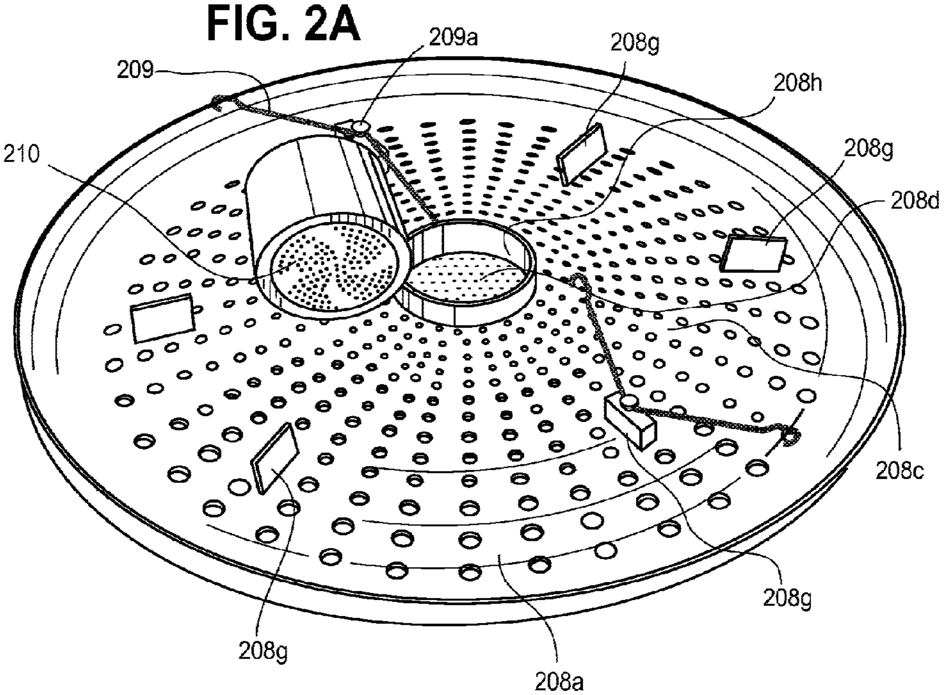
FIGS. 2A-C are perspective views of a second embodiment.
Figure 2B:
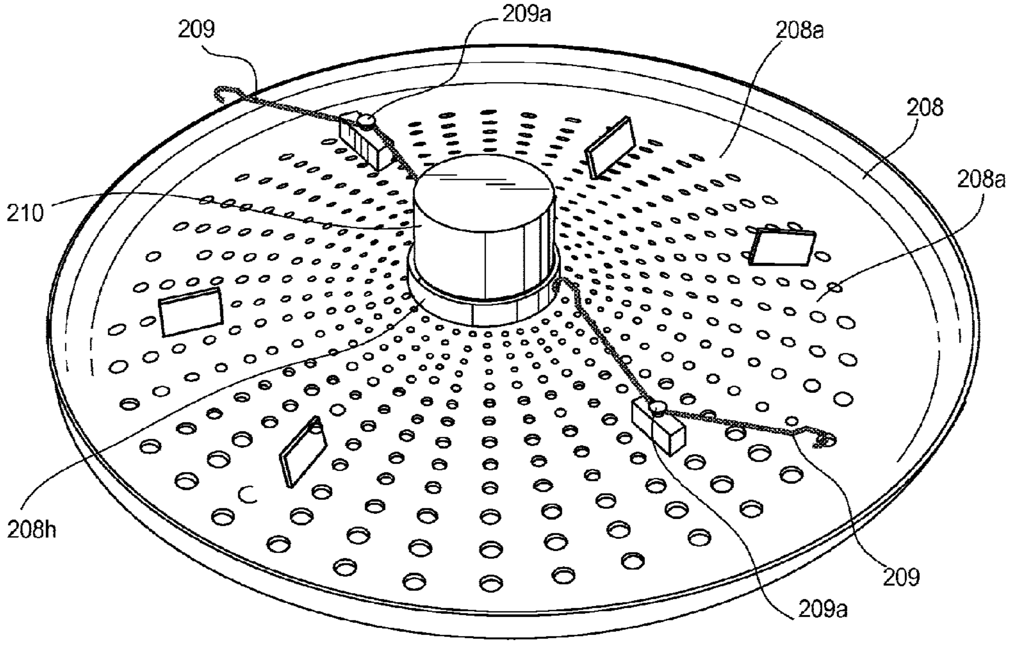
Figure 2C:
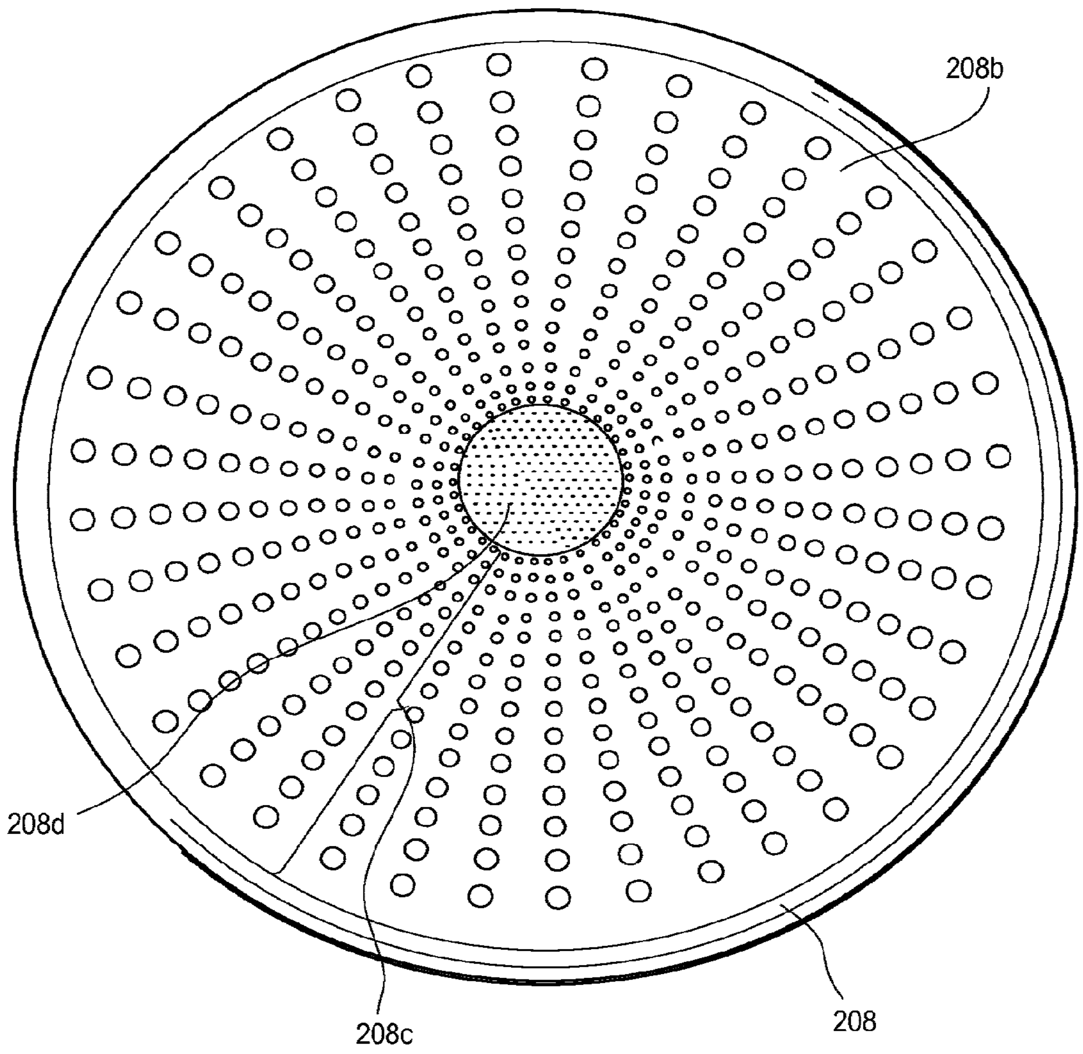
Figure 3A:
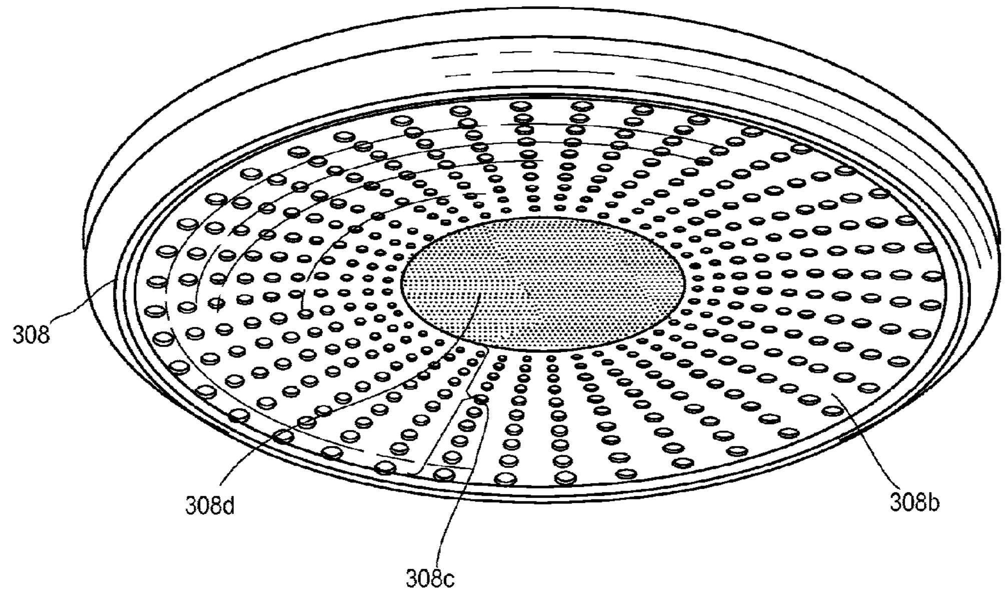
FIGS. 3A-D illustrate a third embodiment without illustration of the speaker.
Figure 3B:
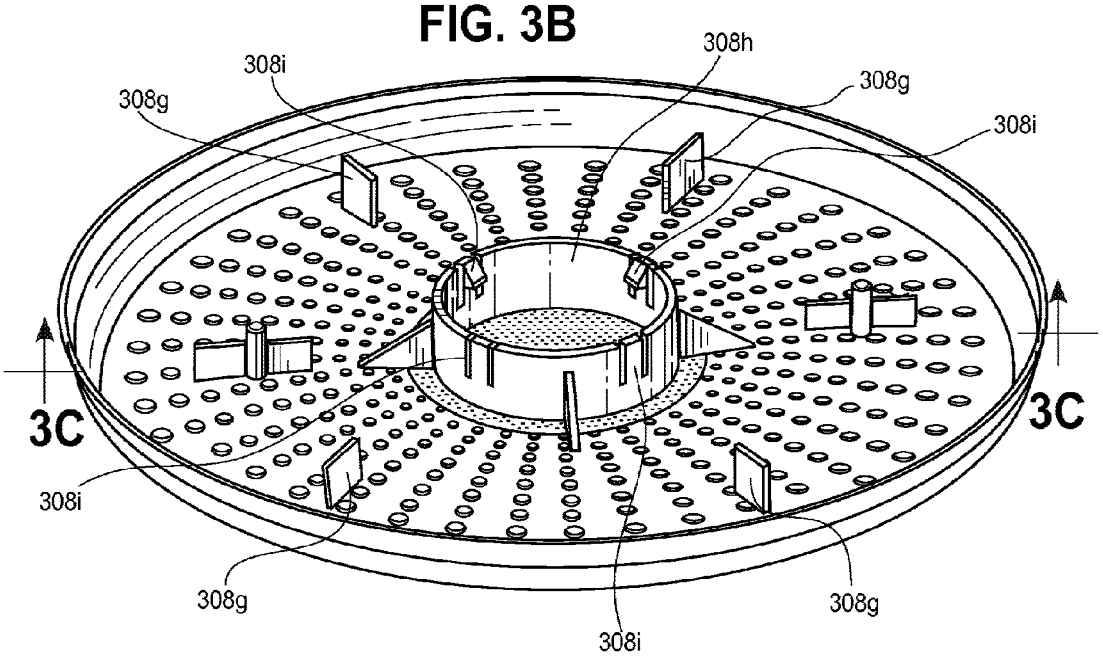
Figure 3C:
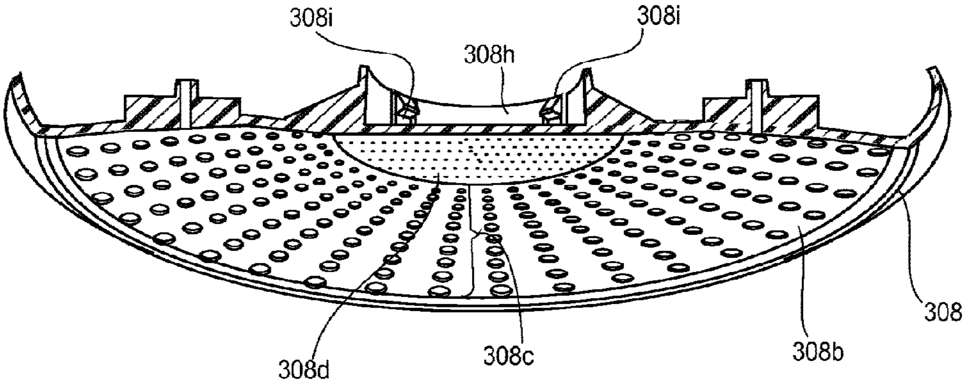
Figure 3D:
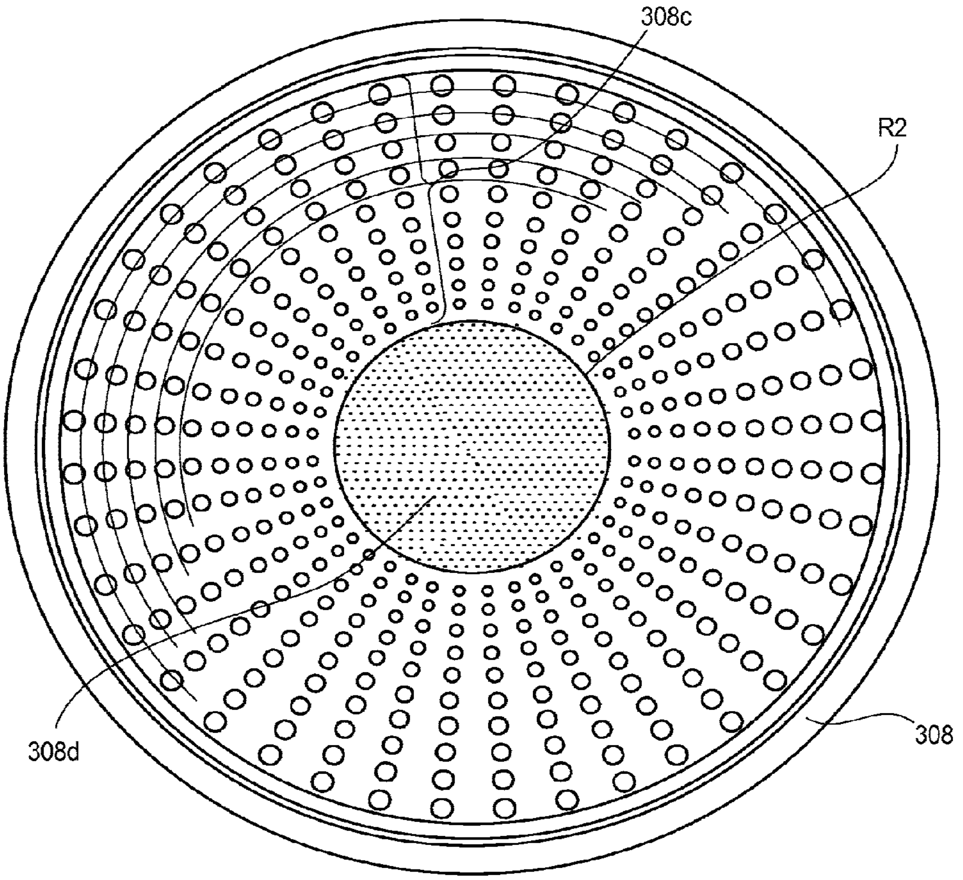

FIGS. 2A-C illustrate another exemplary embodiment of a fan assembly according to the invention. For purposes of convenience, items that are similar to those discussed above with respect to FIGS. 1A-D, will be referenced using the same last two-digit number but using the prefix "2" simply to distinguish one embodiment form another. Thus, in FIGS. 2A-C, the fan assembly is referred to generally by reference numeral 200. In FIG. 2A, a mini Bluetooth speaker 210 is illustrated exploded from the mount 208*h* of grille 208. In this figure, the guide structures 208*g* that help align and/or center grille 208 on the fan assembly housing are also clearly shown. In this form, the guide structures 208 comprise projections or tabs that extend up from the interior surface 208*a* of grille 208. The projections 208*g* preferably are spaced apart to fit just within the opening 202*a* of the air inlet of the housing. In addition, the embodiment of FIGS. 2A-C also illustrates one form of fastener that may be used to connect the grille 208 to the fan housing. The fastener shown is a spring 209 that has first and second distal ends that can be squeezed together to engage or clip into mating receivers or sockets on the side walls of the housing (see, e.g., FIG. 1C). As the grille 208 is pressed up toward the housing the springs 209 expand or the first and second ends separate to pull the grille up tight into engagement with the bottom surface of the housing or the ceiling to which the fan is mounted. To remove, the grille 208 is simply pulled down until the springs 209 can be reached and then the ends of the springs are squeezed together to release the springs from their respective sockets and remove the grille form the housing. In the form illustrated, the springs 209 are connected to the grille 208 via fasteners, such as screws 209*a*.

Yet another grille embodiment is illustrated in FIGS. 3A-D. In keeping with the above this embodiment will use the same last two-digit numbers but with the prefix "3" to distinguish one embodiment with another. In this embodiment, no boarder or blank exists between the first openings 308*c* and second openings 308*d*. In addition, the diameter of the second openings 308*d* is bigger than the diameter of the speaker as can be seen by the fact the second openings 308*d* extend out toward the perimeter or circumference of the grille 208 beyond the annular wall of mount 308*h*. Another difference is that the annular wall of mount 308*h* includes different mating structures for connecting the speaker 210 to grille 208, such as clips 308*i*. In a preferred form, these clips engage mating recesses, such as depressions, in the speaker housing. More particularly, the clips engage shoulders formed by the depressions to securely connect or fasten the speaker to the grille 308.

Figure 4A:
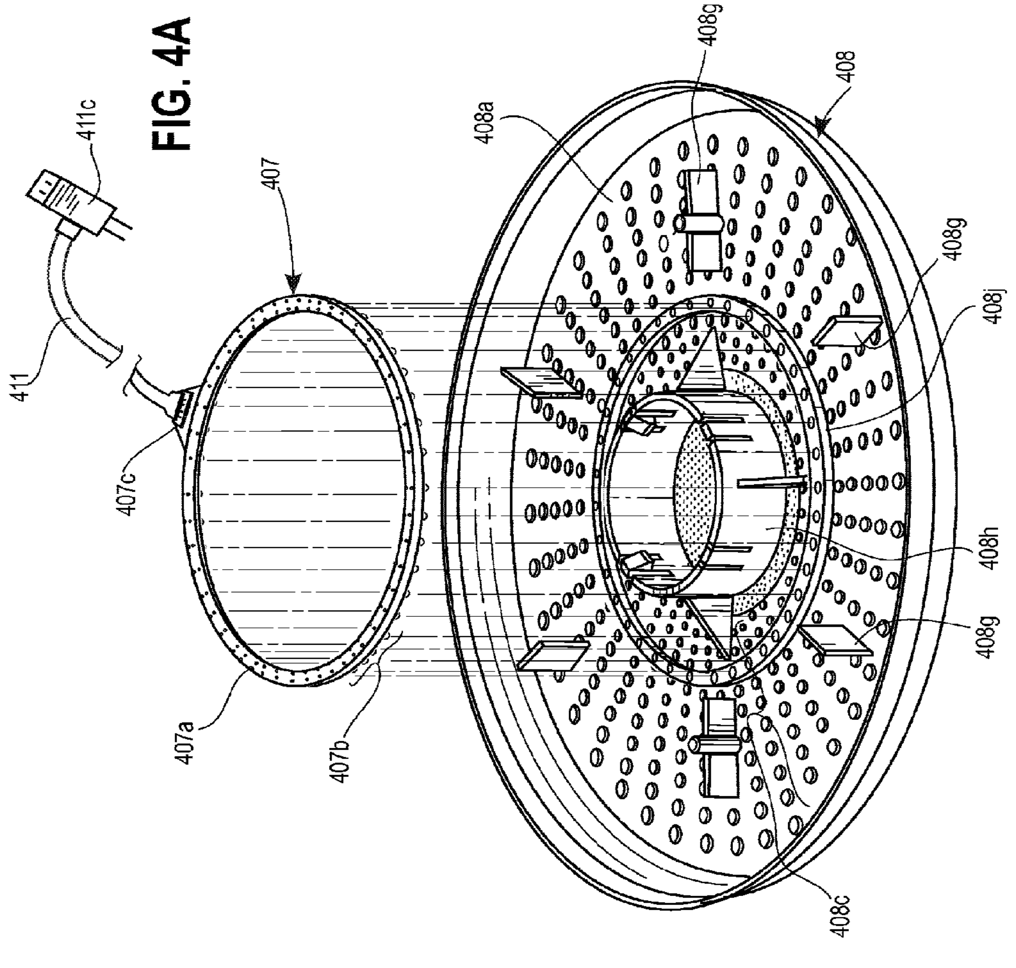
FIGS. 4A-C illustrate a fourth embodiment with FIGS. 4A-B illustrating a light exploded from and connected to the grille and FIG. 4C being partially in section so that internal components are visible.
Figure 4B:
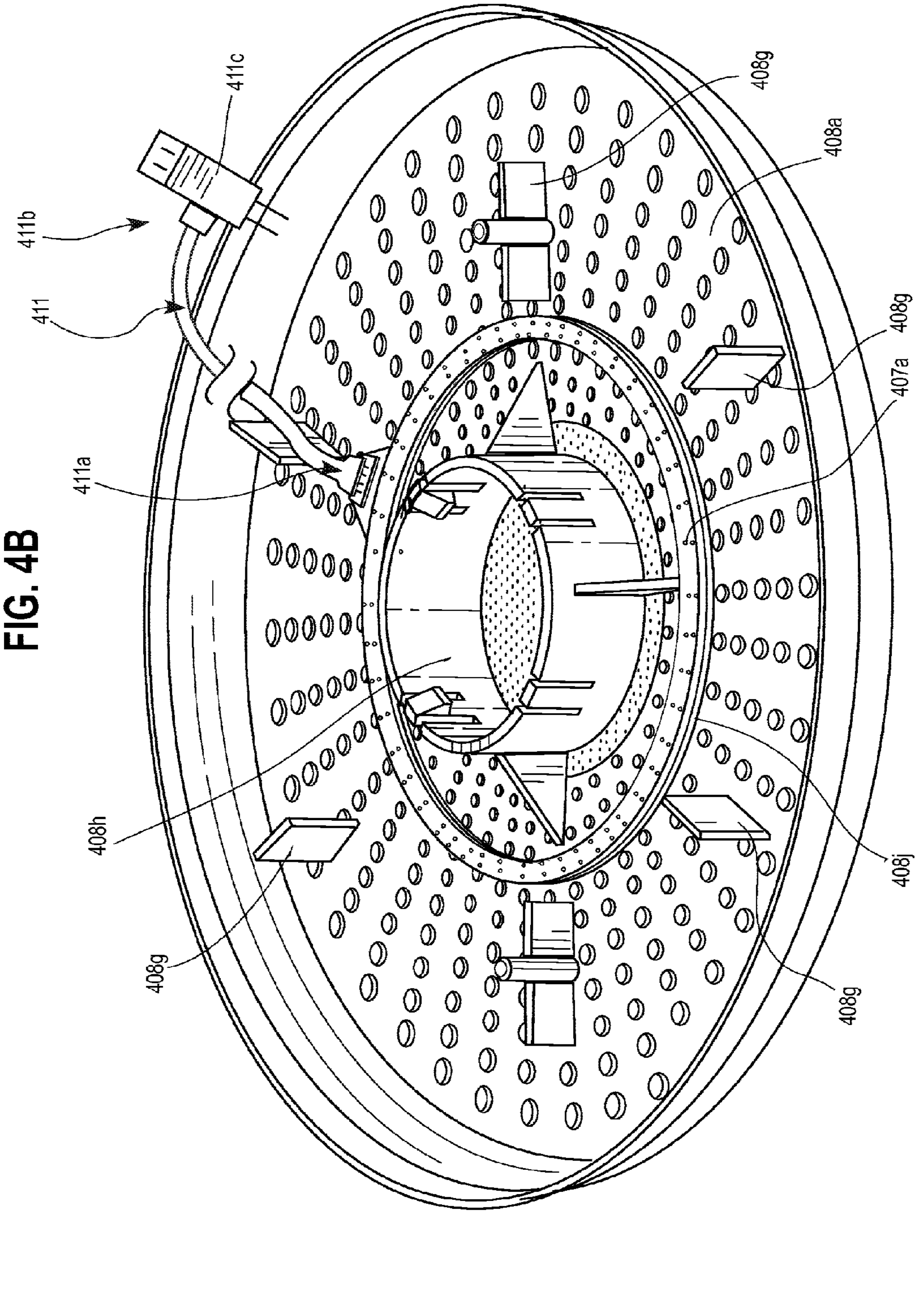
Figure 4C:
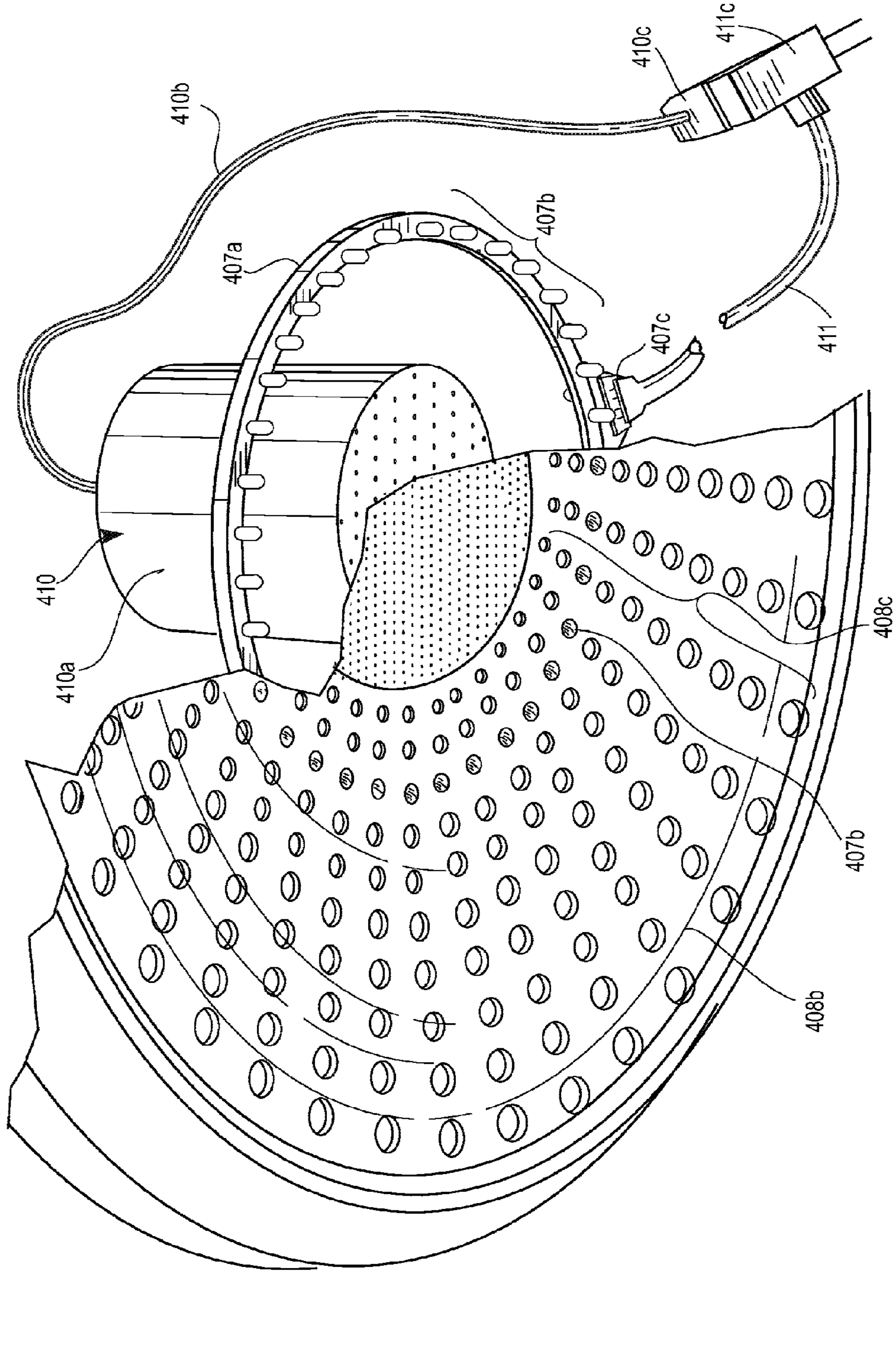

FIGS. 4A-C illustrate a fourth embodiment in accordance with the invention which looks similar to the embodiment of FIGS. 3A-D but with the addition of an optional light for the fan assembly. In keeping with the above this embodiment will use the same last two-digit numbers but with the prefix "4" to distinguish one embodiment with another. In this embodiment, the grille 408 includes a raised wall portion 408*j* that receives at least a portion of optional light assembly 407. In FIG. 4A, light assembly 407 is illustrated exploded from the grille 408 and wall portion 408*j*. Power cord 411 is connected to light assembly 407 and allows the light assembly 407 to be connected to a conventional power outlet which would be located in the fan assembly housing (e.g., two, three or four-pronged power outlets depending on regional power systems where the fan assembly is installed). In a preferred form, light assembly 407 includes a printed circuit board (PCB) 407*a* having a circuit to which are connected a plurality of light emitting diodes (LEDs) 407*b* and a connector or terminal 407*c* to which power cord 411 is connected. The connector 407*c* may take the form of a quick connect/quick disconnect connector that allows the power cord 411 to be readily disconnected from the light assembly 407 so that either the light assembly 407 or power cord 411 can be serviced or replaced if needed. The first end 411*a* of power cord 411 would have a connector halve that mates with the connector halve 407*c* located on PCB 407*a*; whereas, the second end 411*b* would have a plug for connecting into a conventional power outlet.

In the form illustrated, power cord 411 further includes an adapter 411*c* that may include a transformer for converting electrical power from one voltage/current level to another voltage/current level and a rectifier for converting alternating current (AC) to direct current (DC). For example, the adapter 411*c* may be used to convert a 120V AC power source to a 5V (or lower) DC power source to power LEDs 407*b*. Furthermore, in the form illustrated, the power cord 411 is configured as a piggyback power cord which allows a second power cord to be plugged into power cord 411 so that the same power outlet may be used for two components. Thus, with this configuration, the light assembly 407 may be plugged into or connected to a conventional 120V AC power outlet and the connector or plug 410*c* of speaker power cord 410*b* may be plugged into or connected to the piggyback portion of power cord 411 so that the same outlet and adapter is used to power both the fan light 407 and speaker 410. In such an embodiment, the speaker 410 and light assembly 407 would both receive DC power from adapter 411*c* and both would be powered on and off together. One benefit of such a configuration is that an additional power outlet does not have to be added in order to power speaker 410. Thus, fans that are already configured to supply power to a light would not have to be altered in order to add the functionality of a speaker and light.

In the embodiment illustrated, raised wall portion 408*j* defines openings or sockets that LEDs 407*b* are individually aligned with and neatly disposed in when the light assembly 407 and grille 408 are assembled together. This allows light assembly 407 to illuminate portions of the surrounding area on the exterior side 408*b* of grille 408 while still maintaining the desired opening pattern of the first array of openings 408*c* as can best be seen in FIG. 4C. In a preferred form, LEDs 407*b* would be mounted flush with or slightly recessed into the exterior surface 408*b* of grille 408. This may be accomplished by setting the height of the upstanding or raised wall 408*j* so that LEDs 407*b* are so positioned when light assembly 407 is connected to grille 408. The light assembly 407 may also be connected to grille 408 via a fastener or fasteners, such as screws, latches, snap-fittings, etc., if desired.

It should be understood that in alternate embodiments light assembly 407 may take different shapes and sizes including using different types of PCBs, lights (e.g., AC or DC lighting) and power cords 411. Similarly, different types of power outlets and adapters may be used depending on what part of the world the product is being used and/or that regions power grid requirements. In addition, the components of the fan assembly may be placed in different positions.

Figure 5A:
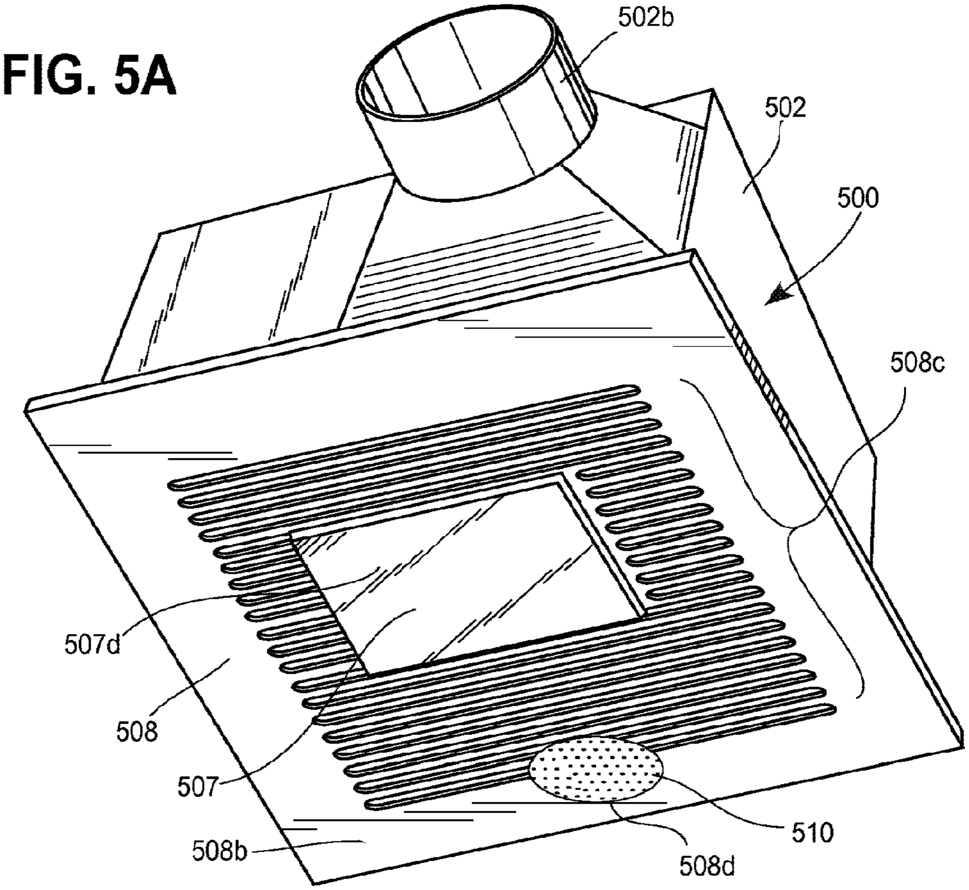
FIGS. 5A-B illustrate perspective and bottom views, respectively, of a fifth embodiment.
Figure 5B:
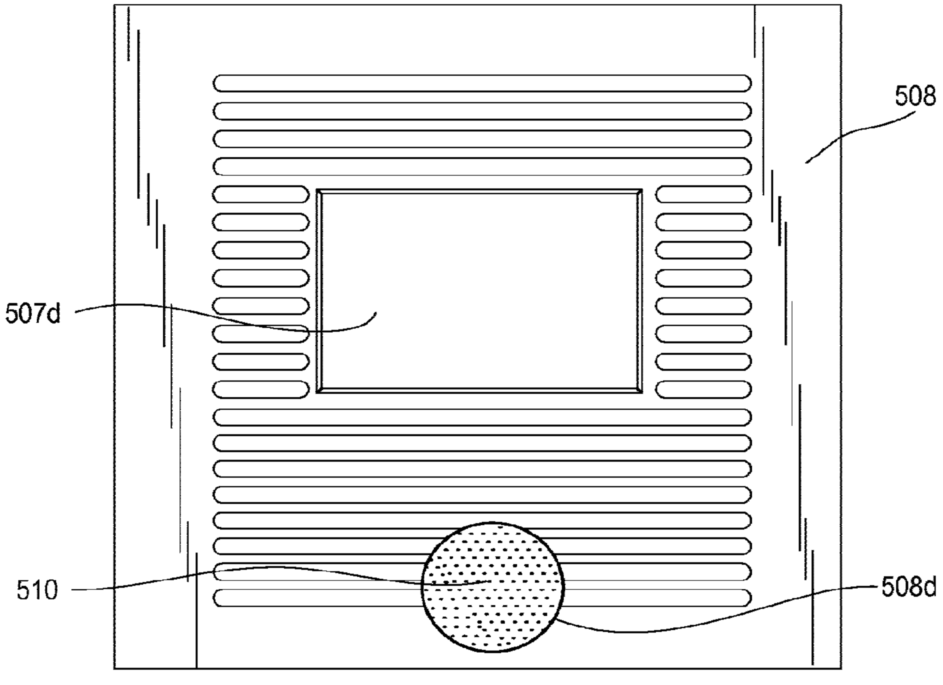

In FIGS. 1A-4C, fan assemblies with round grilles and round speakers are shown and, in the case of FIGS. 4A-C, a round light assembly. However, in alternate embodiments the shapes and sizes of these grilles, speakers and lights may be changed to provide other desired appearances. For example, in FIGS. 5A-B a rectangular grille is illustrated with a rectangular light assembly and a round speaker and in FIGS. 6A-B a rectangular grille, light and speaker are illustrated. In keeping with the above, this embodiment will use the same two-digit reference numerals as prior embodiments but will use the prefixes “5” and “6”, respectively, to distinguish one embodiment from another. More particularly, in FIGS. 5A-B, the grille 508 is square, while light assembly 507 is a non-square rectangle and the speaker 510 is round. In this form, the grille 508 defines a first array of openings 508*c* for ventilation and a single second opening 508*d* with which the speaker 510 is aligned. The first array of openings 508*c* take on generally rectangular shapes with rounded ends. However, in alternate embodiments these openings 508*c* may take on any other desired shape (e.g., sharp rectangles, squares, triangles, circles, ovals, etc.) or patterns (e.g., curved patterns, wave patterns, multiple patterns, etc.). In FIGS. 5A-B, the light assembly 507 further includes a translucent cover that is positioned under the actual light source (whether that be LEDs, low voltage lighting, AC light bulbs, etc.). The speaker 510 is also positioned off to one side of the grille 508 near the perimeter thereof instead of being centered. The actual location is at or near the middle of one side of the fan assembly 500 and the light is positioned more in the middle of the grille 508. In a preferred form, the speaker is positioned so that it is generally flush with the exterior surface 508*b* of the grille 508.

Figure 6A:
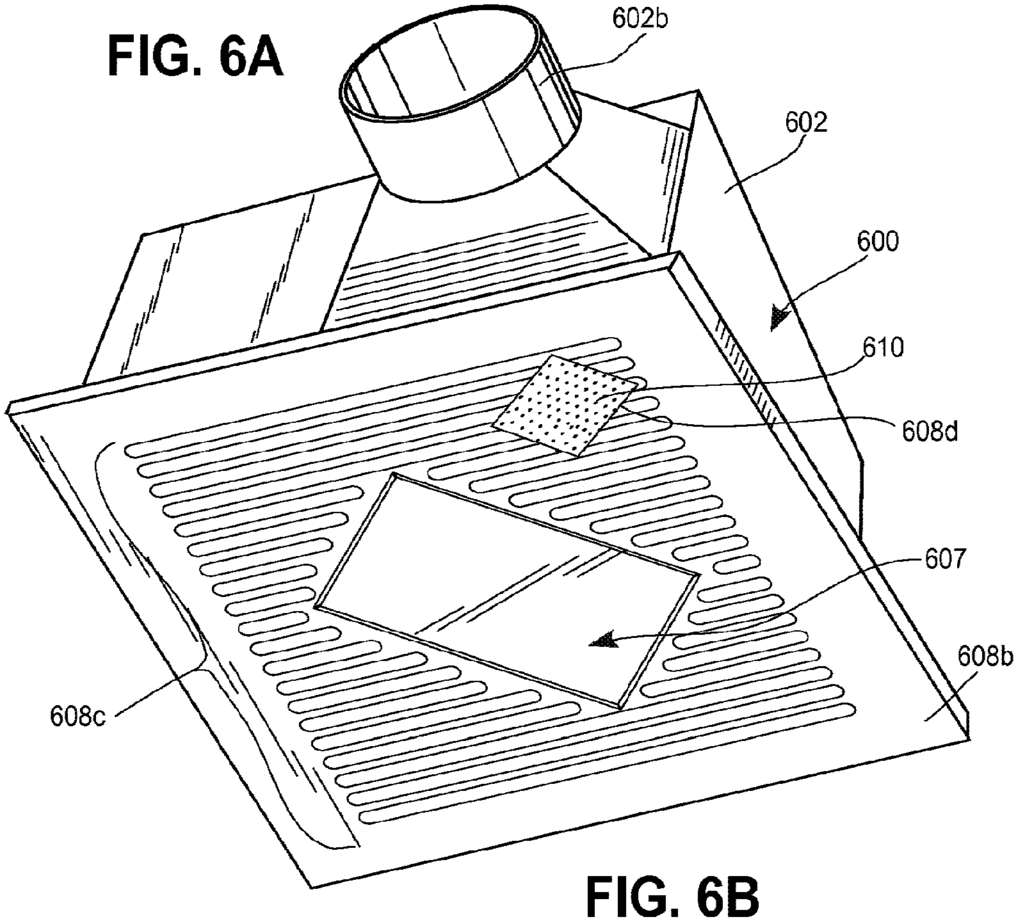
FIGS. 6A-B illustrate perspective and bottom views, respectively, of a sixth embodiment.
Figure 6B:
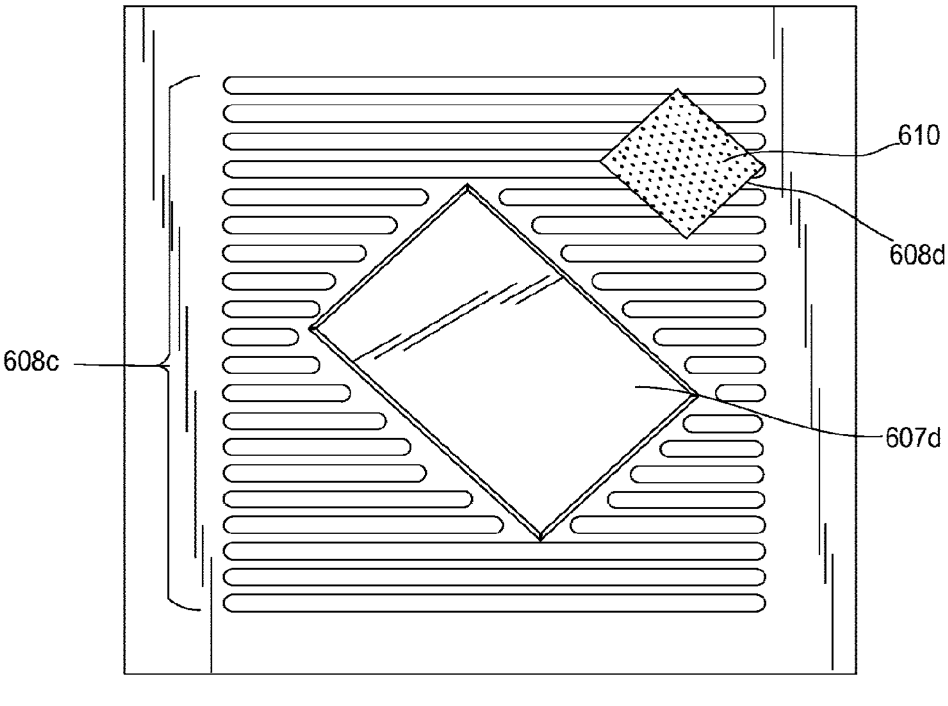

In FIGS. 6A-B, the light assembly 607, grille 608 and speaker 610 are all rectangular in shape. More particularly, in the form illustrated, the grille 608 and speaker 610 are square, the light 607 is rectangular and both the light 607 and speaker 610 are orientated at an angle as compared to the grille 608. Like the embodiment of FIGS. 6A-B, the grille 608 defines a first array of openings 608*c* for ventilation, a single second opening 608*d* with which the speaker 610 is aligned and includes a translucent cover 607*d* positioned under the actual light source. The first array of openings 608*c* take on generally rectangular shapes with rounded ends and the speaker itself is provided with a rectangular body instead of a round body. However, in alternate embodiments these openings 608*c* may take on other shapes or patterns. In FIGS. 6A-B, the light assembly 607 further includes a translucent cover that is positioned under the actual light source (e.g., LEDs, low voltage lighting, AC light bulbs, etc.) and the speaker 610 is positioned in the corner of the grille 608. In a preferred form, the speaker 610 is positioned so that it is generally flush with the exterior surface 608*b* of the grille 608.

Figure 7:
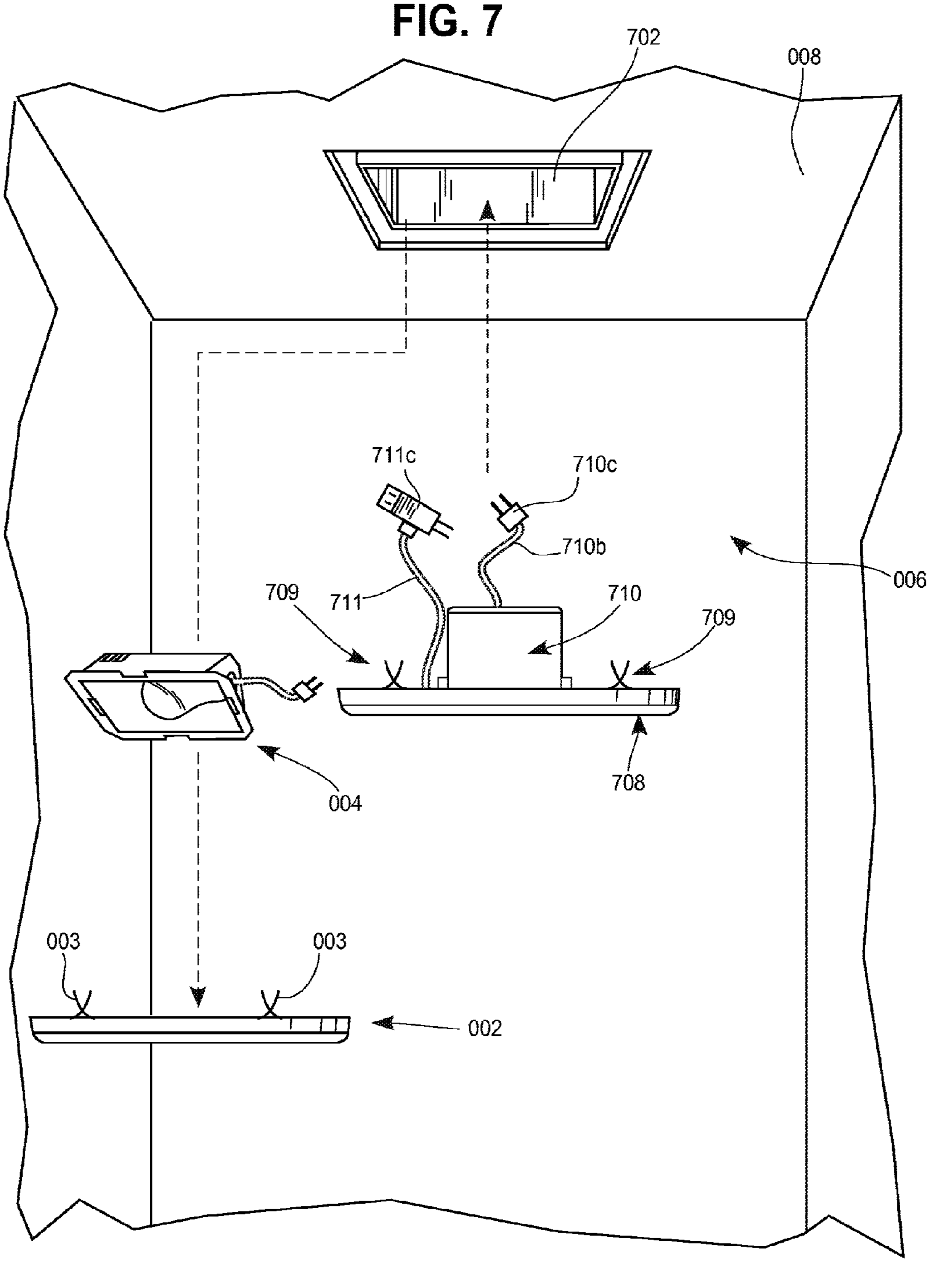
FIG. 7 illustrates a perspective view of a seventh embodiment.

In addition to providing complete fan assemblies like those discussed above, it is also contemplated that retro-fit kits may also be provided in accordance with the inventions disclosed herein. For example, in FIG. 7 a retro-fit kit is illustrated showing how an existing fan grille 002 may be removed from an existing fan housing 702 and replaced with an integrated grille and speaker assembly. More particularly, FIG. 7 illustrates a room 006 having a conventional fan with grille 002 and light 004. A user may remove the grille 002 by pulling down on the grille 002 away from ceiling OOS and then pinching the springs 003 to remove the springs 003 from their mating sockets in fan housing 702. The conventional grille 002 and light 004 may be replaced with a grille similar to that discussed above with respect to FIGS. 4A-C. As with the earlier embodiment, the grille 70S has an integrated speaker 710 connected to the grille 70S and a light assembly connected to a piggyback power cord 711 with a built-in power adapter 711*c*. When replacing the conventional grille 002 and light 004 with new grille 70S, the user can connect the adapter plug 711*c* into the power outlet previously used for conventional light 004 and then connect plug 710*c* of speaker 710 into the outlet end of piggyback cord 711. The grille 70S can then be connected to the mating sockets of the fan housing 702 by pinch or compressing the distal ends of springs 709 and then pressing the grille 70S up to the ceiling 008.

Thus, with this configuration a user is able to retro-fit an older fan assembly with newer components and add features and/or functionality to the fan assembly. Specifically, the user is able to retro-fit the existing fan assembly with a newer grille 70S and light and add features/functionality by way of adding a speaker 710 to the fan assembly and room 006 and by replacing a less energy efficient incandescent light bulb with a more energy efficient LED light fixture. In other examples, a user can retro-fit an existing fan assembly without a light with a new grille and built-in speaker (e.g., hard-wired in, battery operated, etc.).

Figure 8:
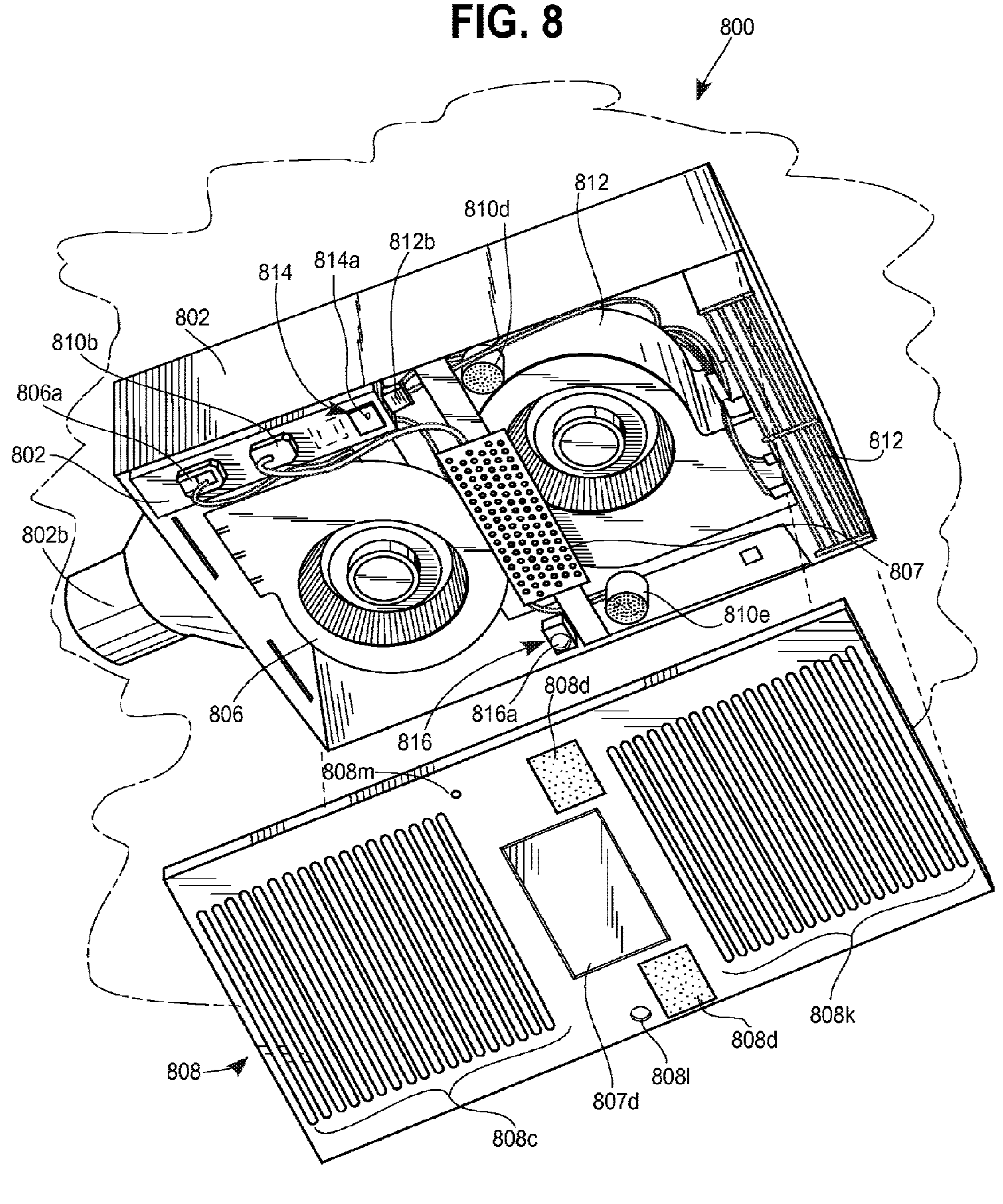
FIG. 8 illustrates a perspective view of an eighth embodiment.

Another fan assembly embodiment is illustrated in FIG. 8 showing additional features and functionality that can be provided in accordance with the invention disclosed herein. In keeping with prior practice, similar features to those discussed above will be referenced using the same two-digit reference numeral preceded with the prefix "S". In this embodiment, a fan assembly 800 is illustrated having a fan 806, light 807, dual speakers 810*d* and 810*e*, heater 812, humidity sensor 814 and motion detector 816. More particularly, the fan assembly 800 has a grille 808 with a first array of openings 808*c* for fan 806, a second set of openings 808*d* for speakers 810*d*, 810*e*, and a third array of openings 808*k* for heater 812. Although the fan 806 operates similar to those discussed above, the heater 812 operates a little differently. For example, rather than sucking air up through vents or baffles 808*k* and pushing the air out the side of the fan assembly housing 802 via duct work, the heater actually pulls air up through the vents or baffles located on one side of the third array of openings 808*k* (e.g., on the left side of 808*k* as depicted in FIG. 8) and blows this air over heating coils and out duct 812*a* and the opposite side of the third array of openings 808*k* (e.g., on the right side of 808*k* as depicted in FIG. 8). In a preferred form, a controller uses one or more thermocouples to monitor the temperature of the heated air blowing from duct 812*a* to adjust the heating coils to regulate and maintain the desired temperature of the blown air.

Fan assembly 800 further includes dual speakers 810*d*, 810*e* which are positioned on opposite sides of assembly housing 802. In the form illustrated speakers 810*d*, 810*e* are hard-wired to a power source, but with the motion detector 816 serving as the actuator for powering or turning on the speakers. Specifically, the motion detector 816 serves as either a signal generating device for signaling a controller to actuate the speakers 810*d*, 810*e* or as a normally open switch that automatically closes and activates the speakers when the detector 816 detects the presence of movement. In FIG. 8, motion detector 816 is a passive infrared detector that uses body heat or changes in heat to detect movement. It should be understood, however, that the motion detector 816 may be active or passive and may use any known technique for detecting movement (e.g., passive infrared, ultrasonic, microwave, tomographic, video, etc.). In the form illustrated, the grille 808 defines an opening 8081 through which the sensor 816*a* of motion detector 816 protrudes. In a preferred form, the sensor 816*a* is a dome type structure offering detection of heat in a three-hundred and sixty degree field of view. Although the embodiment shown illustrates the speakers being on the heater side of the fan assembly, it should be appreciated that in alternate embodiments, the speakers may be positioned on the fan side of the fan assembly and/or may be positioned in other locations on the fan assembly (e.g., in the corners, in alternate corners, etc.) if desired.

In addition to the motion detector 816, fan assembly 800 further includes a humidity sensor 814 which is used to detect humidity present in the surrounding area of the fan assembly 800 and for turning on the fan 806 when a threshold humidity level has been reached. Like the motion detector 816, the humidity sensor 814 may be setup to transmit a signal that a controller will use to determine when to actuate the fan 806, or it may be used as a normally open switch connected to the fan 806 that closes once the threshold humidity level has been detected, thereby actuating fan 806. In the form illustrated, the humidity sensor 814 includes an LED 814A that extends through opening 808*m* in grille 808 and is illuminated when the threshold humidity has been reached so that any individuals present will know that the fan assembly 800 has been activated because of the detection of a threshold humidity amount. However, it should be appreciated that in alternate embodiments, the LED 814*a* may be activated or illuminated in different manners to signify different things to individuals who are present. For example, the humidity sensor 814 could be configured to cause the LED 814*a* to blink when the threshold humidity has been reached and the fan has been activated. In other forms, the humidity sensor 814 may not be provided with an LED 814*a*.

The humidity sensor 814 may be used to automatically turn on and off the fan assembly 800 as needed. For example, the humidity sensor 814 may be used to activate the fan as mentioned above when a threshold humidity level has been detected and to deactivate the fan 800 when the humidity level has dropped below the threshold amount. In other forms, the humidity sensor's activation of the fan 800 may trigger a timer that allows the fan assembly 800 to operate for a predetermined period of time before deactivating the fan assembly 800. In still other forms, the humidity sensor 814 may be used to either constantly check humidity levels or periodically check humidity levels and to operate the fan once a threshold humidity level has been reached or surpassed. A humidity sensor is disclosed in published U.S. Patent Application No. 2011/0138908A1 published to Liu et al. On Jun. 16, 2011, the disclosure of which is incorporate herein by reference.

Turning back to the fan assembly 800 of FIG. 8, the fan assembly 800 preferably includes a power strip 802 having one or more power outlets. In the form illustrated, the speakers 810*d* and 810*e*, motion detector 816 and humidity sensor 814 are all hard-wired to a power supply. However, the fan 806, blower 812 and light assembly 807 are all connected to the power strip 802 using conventional connectors for the particular region the assembly is installed in. Specifically, power cord or plug 806 connects fan 806 to power strip 802, power cord or plug 810*b* connects the light assembly 807 to power strip 802, and power cord 812*b* connects heater 812 to power strip 802. In a preferred form, three separate wall switches are provided with each actuating one of the fan 806, light assembly 807 and heater 812, while the speakers 810*d* and 810*e* are activated independently and automatically by the motion detector 814. In this configuration, three-way wiring and switching will be used for fan 806 so that either the wall switch or the humidity sensor is able to activate the fan 806.

It should be understood, however, that in alternate embodiments, the fan assembly 800 may be wired in a variety of different manners. For example, if it is desired to have the fan and speakers go on at the same time, the fan and speakers could be wired together or a piggyback switch like the type discussed above could be used. Alternatively, the fan assembly could be designed so that the fan, heater, light and speakers are each independently operable via designated actuators or switches (with both speakers preferably being wired to one actuator or switch). In such an embodiment, the power strip 802 may include an additional outlet 802*a* which the speakers 810*d* and 810*e* may be connected to via a power cord that is controlled by a remote actuator such as a wall switch.

Figure 9A:
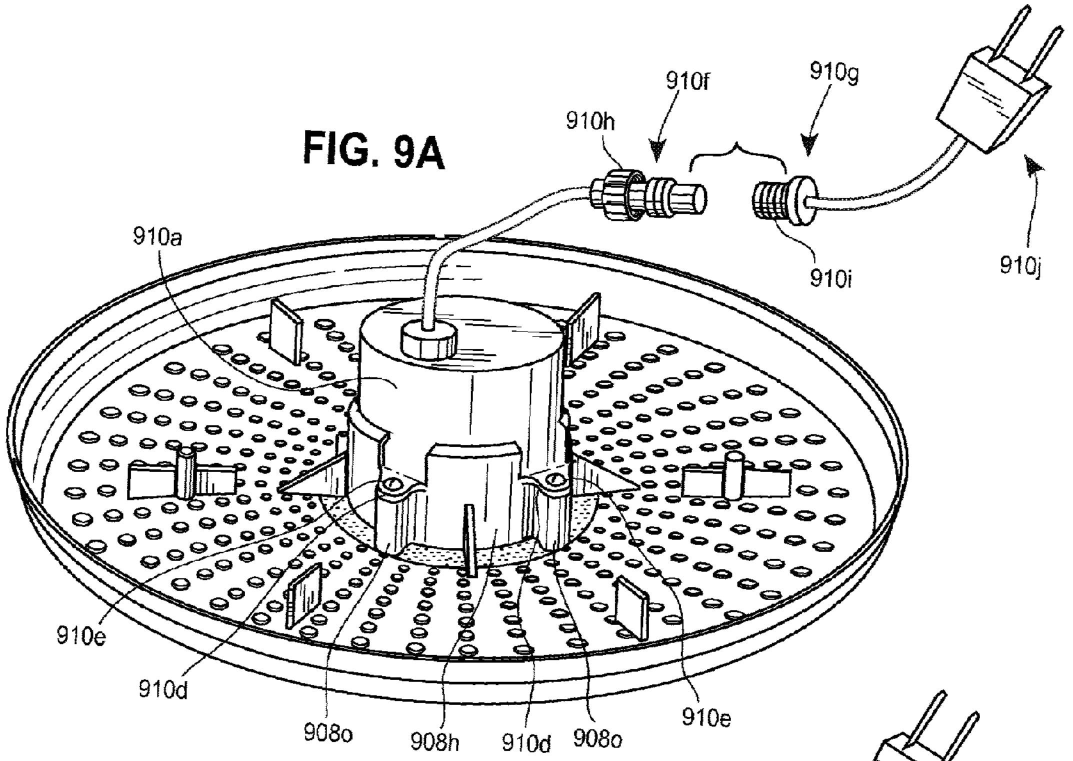
FIGS. 9A-B illustrate perspective views of a ninth embodiment.
Figure 9B:
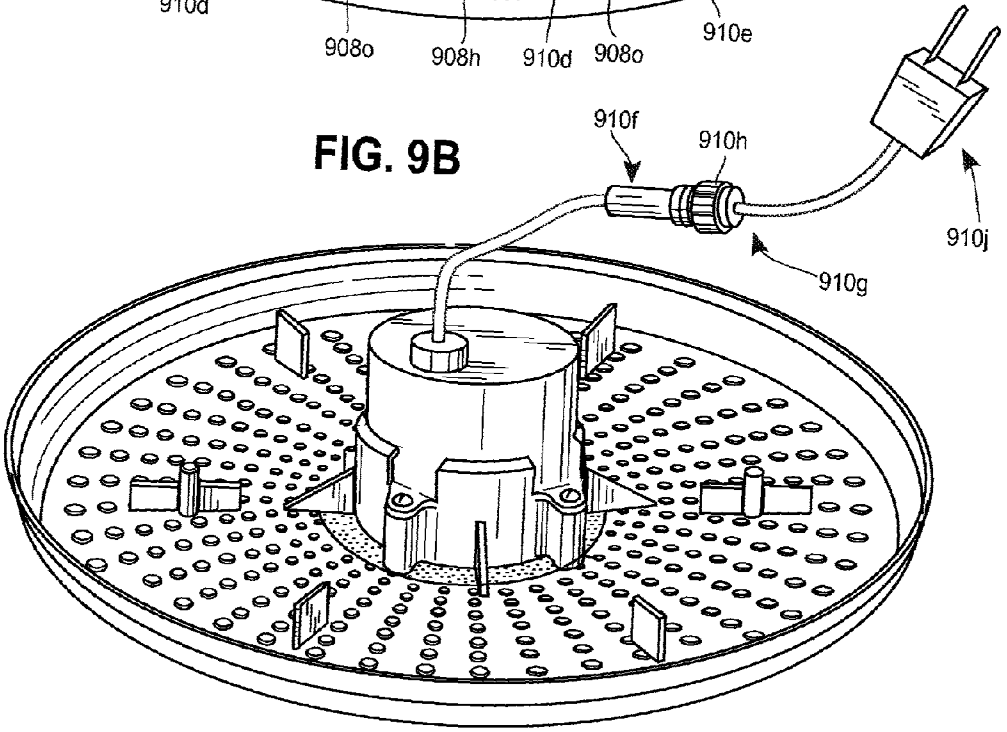

FIGS. 9A-B illustrate another embodiment in accordance with the invention. In keeping with prior practice features common with those discussed above will use the same two-digit reference numeral with the addition of the prefix "9" simply to distinguish one embodiment from the others. In the embodiment illustrated in FIG. 9, grille 908 and motor 904 are illustrated which are similar to those discussed above with respect to FIGS. 1A-4C. Unlike prior embodiments, however, the speaker 910 includes alignment tabs or projections 910*d* which align and mate with guides such as mating notches and bores, 908*n* and 908*o*, respectively. More particularly, the projections or male guide structures 910*d* extending outward from the cylindrical sidewall 910*a* of speaker 910 are aligned with corresponding notches or female guide structures 908*n* defined by grille mount 908*h*. In a preferred form, the male guide structures each have an opening that is aligned with a corresponding bore 908*o* defined by grille mount 908*h* when the male guide structures 910*d* are inserted into the mating female guide channels 908*n* defined by grille mount 908*h*. Once the speaker 910 is fully inserted into the grille mount 908*h*, the male guide structures 910*d* abut bores 908*o* such that the speaker 910 may be fastened to the grille mount 908*h* via fasteners such as screws 910*e*. This configuration allows the grille to be packed, shipped and handled more securely and makes it less likely that the speaker 910 will be inadvertently removed from grille 908.

In addition to the differences relating to how the speaker 910 is mounted in grille mount 908*h*, the speaker 910 also has a different power cord 910*b*. More particularly, the power cord 910*b* includes first and second connectors 910*f* and 910*g*, respectively. In a preferred form, these are mating quickly connect/quick disconnect connectors. To connect, the first and second connectors 910*f* and 910*g* are connected with one another as shown in FIG. 9B and then a fastener, such as nut member 910*h*, is fastened to connect the first and second connectors 910*f* and 910*g* together so that they cannot inadvertently be removed from one another. More particularly, nut member 910*h* is thread onto the external threading 910*i* of second connector 910*f* to secure the two connectors 910*f*, 910*g* together. Then the plug 910*j* may be connected into a power outlet. As with above-mentioned embodiments, the plug 910*j* will preferably include an adapter for converting AC to DC to power the speaker 910.

FIGS. 10A-D illustrate another embodiment in which an alternative or auxiliary power source such as a battery backup system enables constant, uninterrupted audio to be provided by the Bluetooth speaker module or assembly 1010 and/or allows for the pairing to be maintained between the Bluetooth speaker module 1010 and a paired electronic device even if mains power is interrupted for a period of time. As discussed above, an actuator or controller is configured to turn on and off both the fan (not shown) and speaker module 1010. In one form and as discussed above, the actuator may be toggled a first number of times to instruct the controller to turn on both the fan and the speaker. Toggling the actuator on and off a second number of times may instruct the controller to turn on the speaker only and not the fan. In the event a user desires to switch from one configuration to another, that is, between powering both the speaker and fan or powering the speaker only, the speaker will experience a brief period where it is not receiving power from the AC power source due to the actuator being briefly toggled to the off position. During this period, in the absence of an auxiliary power source, such as a battery backup, the Bluetooth speaker module 1010 may lose its connection or pairing with the electronic device and thus require the electronic device to again undertake the handshake or pairing process to enable audio to be played by the speaker. This can be a time consuming process in which the user's enjoyment of audio is greatly reduced.

The audio-equipped fan depicted in FIGS. 10A-D includes an auxiliary power source, such as battery 1012 that can temporarily provide power to the Bluetooth speaker module 1010, under certain circumstances, e.g., in the event the actuator is toggled to switch between operating modes. In this embodiment, the controller determines whether the Bluetooth speaker module 1010 is receiving AC power during the toggling of the actuator. If AC power is not being supplied to the Bluetooth speaker module 1010, the controller immediately switches to battery power to provide power to the Bluetooth speaker module 1010. In this manner, the Bluetooth speaker module 1010 does not incur a loss of power and thus continuously plays audio through the speaker 1010*k* and/or maintains the pairing between speaker module 1010 and the electronic device serving as the source of the audio data broadcast by speaker module 1010. In the form shown, the speaker module 1010 includes a Bluetooth controller or control circuit. The control circuit includes a transceiver/antenna module 10101 and amplifier 1010*m* for amplifying the audio data supplied to transducer or loudspeaker 1010*k*. The auxiliary power source 1012 includes a lithium battery 1012*a* and first and second electronic switches, such as transistors 1012*b* and 1012*c*, respectively.

In this embodiment and corresponding methods, the Bluetooth speaker module 1010 is configured to automatically detect the power source being received. If the Bluetooth speaker module 1010 detects that its power is being received from the battery 1012, it will measure the time period during which this is occurring, e.g., it may initiate a timing sequence, or initiate operation of a timer. If the Bluetooth speaker module 1010 detects an AC power source within a predetermined time period, e.g., seven seconds (meaning that the actuator was toggled to a "speaker on" position within the predetermined time period), the module 1010 (including speaker 1010*k*) will remain on. If the Bluetooth speaker module 1010 does not detect an AC power source within the predetermined time period, a first electronic switch such as PAD transistor 1012*b* in the battery management integrated circuit 1012 will be triggered to cut battery power to the Bluetooth module 1010 so that the unit automatically shuts off and does not continue to use battery power. In the form shown, a signal is transmitted from the Bluetooth controller to first electronic switch 1012*b* to turn "on" first switch 1012*b* and ground the second electronic switch 1012*c*, thereby shutting "off" the second electronic switch 1012*c* or opening circuits the battery circuit so that the battery 1012*a* no longer supplies power to the Bluetooth module 1010. Thus, with this configuration the speaker module can operate without interruption if the user toggles the actuator to switch between operating modes of the fan assembly (e.g., between fan & speaker on mode and speaker only on mode) and is capable of automatically shutting off the speaker module if continued use is not desired or intended.

In some embodiments, the battery 1012 may be a flat or low profile type rechargeable lithium battery 1012*a* configured to provide approximately 100 mAh of power and having dimensions of approximately 30 mm×12 mm×4 mm. The battery 1012*a* will preferably be capable of functioning as intended for a long period of time (e.g., approximately two years or longer) to avoid the need for frequent replacement, but may be replaced by removing the speaker assembly from the fan grille and removing the speaker from the speaker assembly housing to gain access to the battery.

In some embodiments, the auxiliary power source 1012 is connected to the Bluetooth module 1010 in parallel with the AC power source and may be rechargeable. In a preferred form, the battery 1012*a* may be recharged under two different circumstances. First, when the battery management integrated circuit or auxiliary power source circuitry 1012 detects a low battery voltage, the circuit is configured to charge the battery 1012*a* until it reaches its full capacity. The Bluetooth controller may also send a charge command to charge the battery 1012*a* when the apparatus is operating under normal conditions and is using the AC power source. In some embodiments, the battery may include a charging protection mechanism to eliminate the risk of overcharging an a fire suppressing film or coating such as a polymer bag the battery 1012*a* is disposed in to prevent damage from a malfunctioning battery 1012*a*. As an alternative to use of a battery backup, the system may include other components or systems for preventing interruption of power, e.g., one or more capacitors, inductors, or the like, which serve as temporary power supplies to power the Bluetooth speaker assembly 1010 as it transitions between operating modes.

Figure 10A:
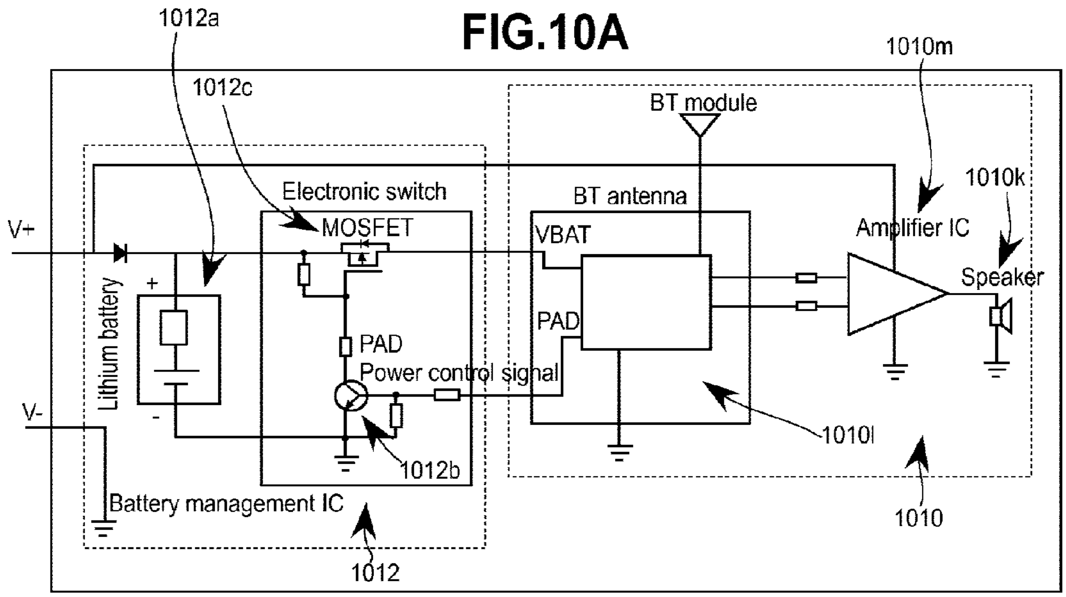
FIGS. 10A-D illustrate a tenth embodiment with FIGS. 10A-B illustrating circuit diagrams of the tenth embodiment and FIGS. 10C and D illustrating a battery backup controller in accordance with the tenth embodiment.

In some embodiments, the electronic switches include a plurality of transistors configured to control operation of the Bluetooth module using battery power. As illustrated in FIG. 10A, the electronic switches 1012*b*, 1012*c* may include a NPN transistor and a MOSFET transistor, respectively. It will be understood that other conventional transistors may be suitable for operation of the electronic switches and/or that other forms of electronic switches may be used, such as thyristors or the like. An exemplary embodiment of the battery backup Bluetooth module of FIG. 10A is illustrated in FIGS. 10C-D, with FIG. 10C illustrating a first side of a printed circuit board (PCB) 1010*o* containing surface mount and through-hole electronic components including among other items first and second electronic switch 1012*b* and 1012*c*, respectively, and FIG. 10D illustrating a second, opposite side of the PCB 1010*o* containing lithium battery 1012*a* which is electrically connected to the first side of the PCB via battery leads 1012*d*. The Bluetooth speaker 1010*k* is also connected to the first side of the PCB via speaker leads 1010*n* which preferably (and like battery leads 1012*d* and power cord 1010*b*) connect to the PCB 1010*o* via quick connect terminals to make assembly and repair/replacement easy to accomplish by making it easy to connect and disconnect these items to and from the PCB. In the form shown, the Bluetooth speaker module 1010 is assembled by connecting the PCB 1010*o* to threaded bosses 1010*p* via fasteners, such as screws 1010*q*. The PCB 1010*o* defines openings in its corners through which the fasteners 1010*q* are disposed and mated to threaded bosses 1010*p* to secure the PCB 1010*o* to the round speaker housing 1010*a*. For convenience, FIG. 10C illustrates the PCB disconnected from and rotated away from bosses 1010*p* so that the bosses 1010*p* are visible, but it should be understood that the PCT is rested on and secured to bosses 1010*p* by fasteners 1010*q* when the speaker assembly 1010 is assembled. The speaker 1010*k* is then secured to the open end of the cup-shaped housing 1010*a* using fasteners that are mated to a second set of threaded bosses 1010*r*. In a preferred form and as illustrated, a seal, such as O-ring 1010*s*, is used to create a sealed engagement between the speaker face plate containing speaker 1010*k* and the round speaker housing 1010*a* to help prevent moisture from harming the speaker assembly 1010 when used in applications that subject the apparatus to humidity, such as in a bathroom exhaust fan applications.

Figure 10B:
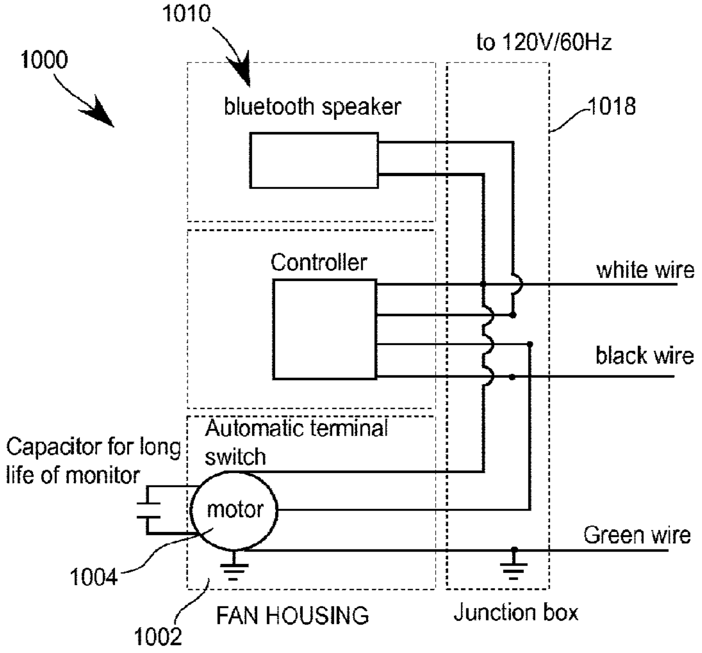
Figure 10C:
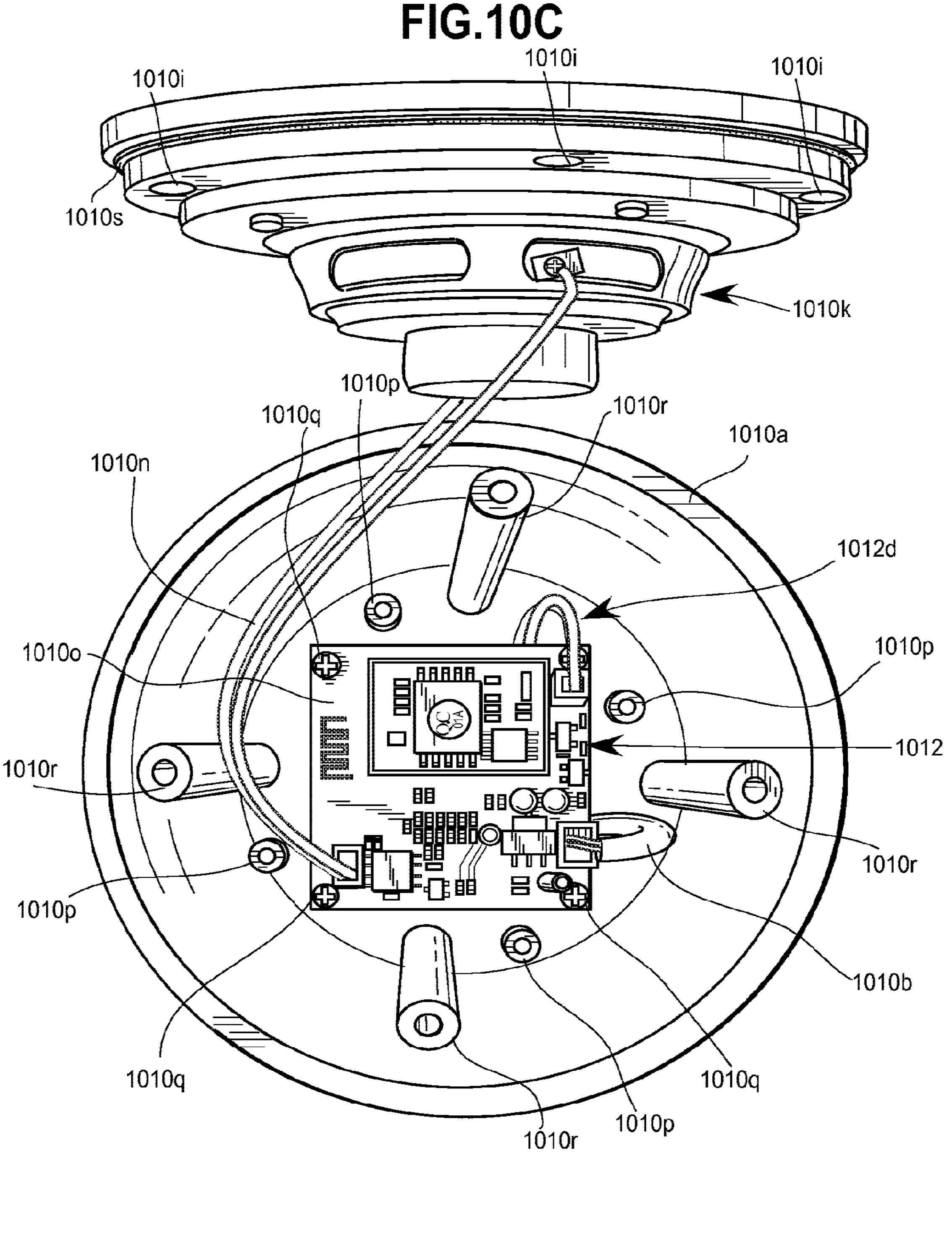
Figure 10D:
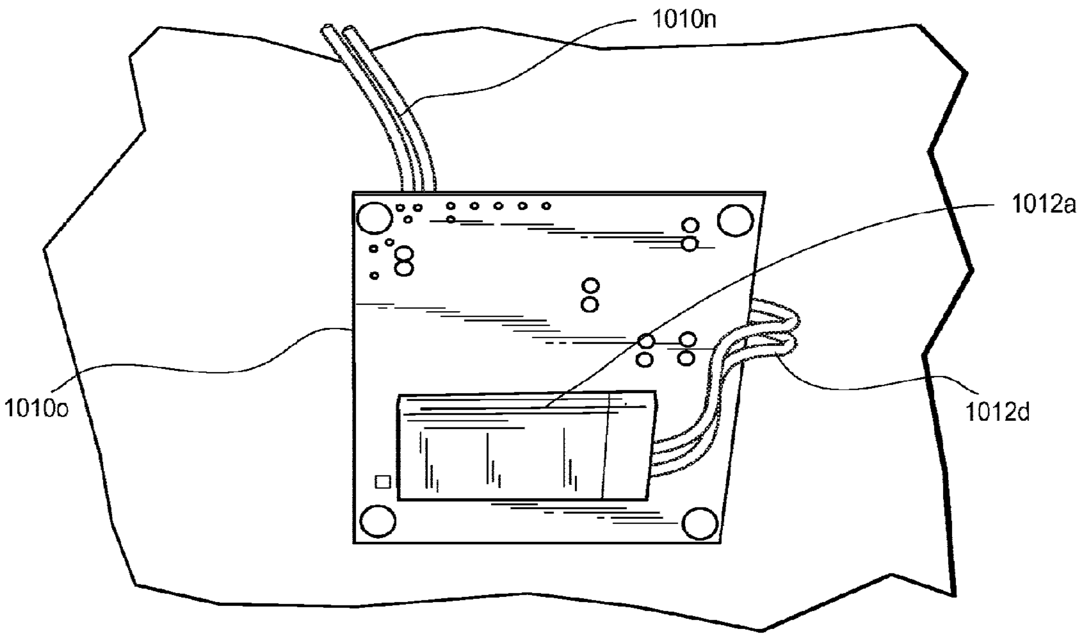

As illustrated in FIG. 10B, the Bluetooth module 1010 is then wired to (or electrically connected to) junction box 1018 as are the fan assembly and main system controller/toggle switch that PLC communications are conducted through. In a preferred form, the junction box 1018 is connected to or even located within the fan housing 1002 so that the entire assembly 1000 may be installed more easily into a typical exhaust fan cutout (very much like the power strip 802 discussed in FIG. 8 above). The power strip or junction box 1018 may contain outlets for plugging the Bluetooth speaker module 1010 and any additional accessories into (e.g., lights, humidity sensors, motion detectors, heaters, etc.) or, alternatively, these could be hard wired together at the junction box 1018. In a preferred form, all will be configured to operate via a wall switch, such as one or more wall plate toggle switches or the like, and all will utilize connectors that make components of the assembly 1000 easy to assembly and disassemble for installation and repair/replacement, respectively.

As stated above, in some embodiments the battery 1012 may provide power to the Bluetooth module 1010 for up to about seven seconds. In other embodiments, the battery may alternatively be configured to provide power to the Bluetooth speaker for more or less time, for example between one second and several minutes. In some forms, the module 1010 may even be configured to allow the auxiliary power source to supply power during unexpected power outages (e.g., power outages in mains or line power, etc.).

Figure 11A:
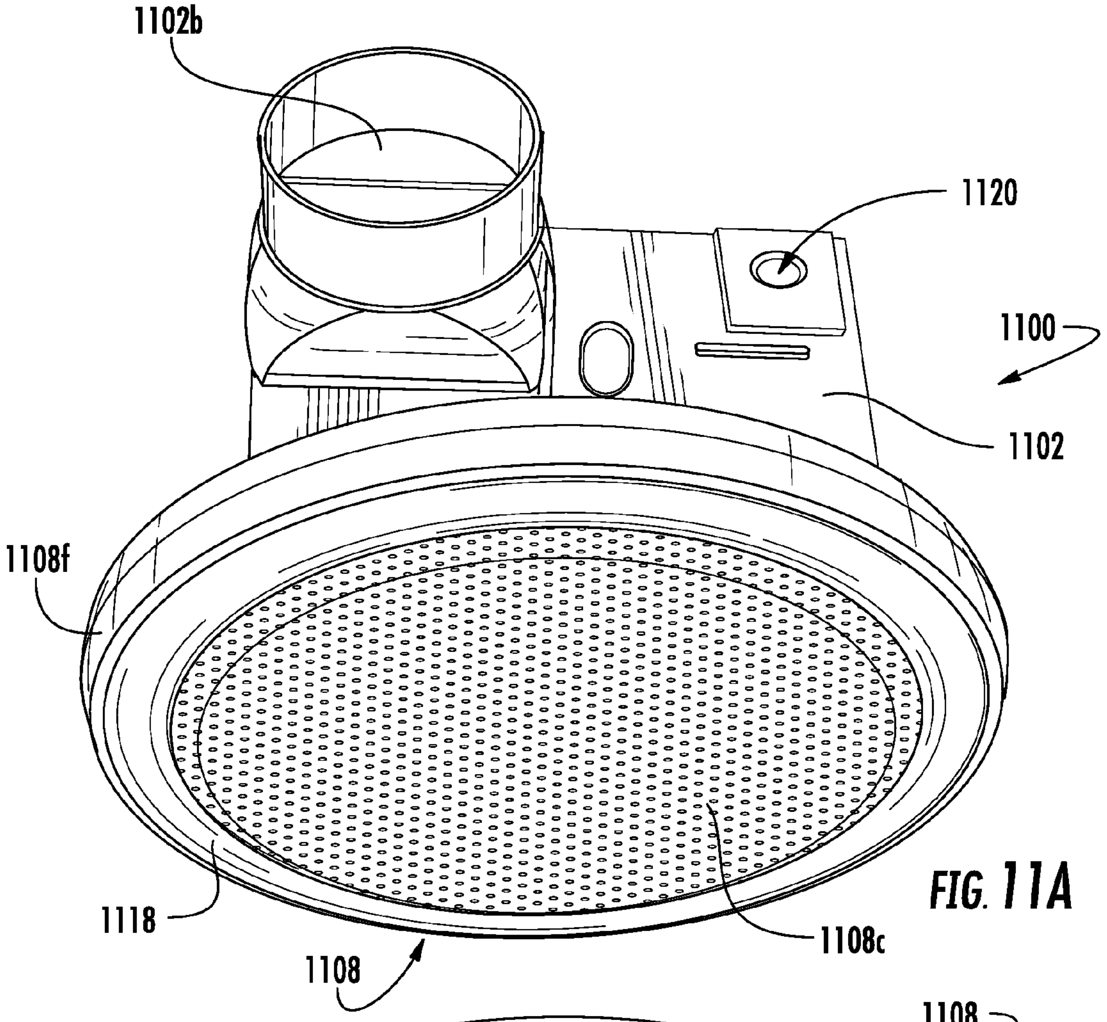
FIGS. 11A-11C illustrate another implementation of a fan assembly in accordance with another embodiment.
Figure 11B:
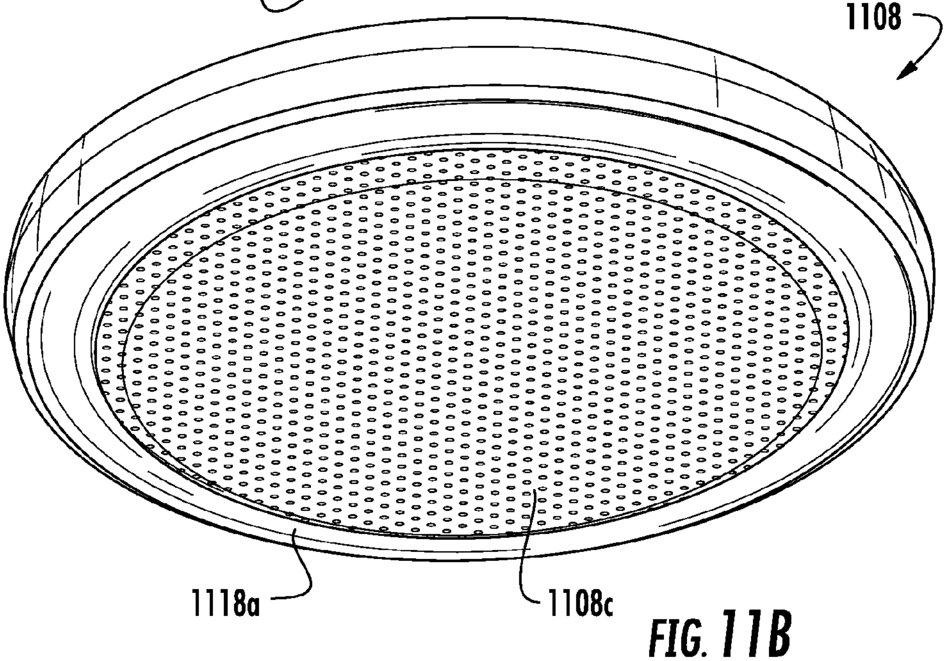
Figure 11C:
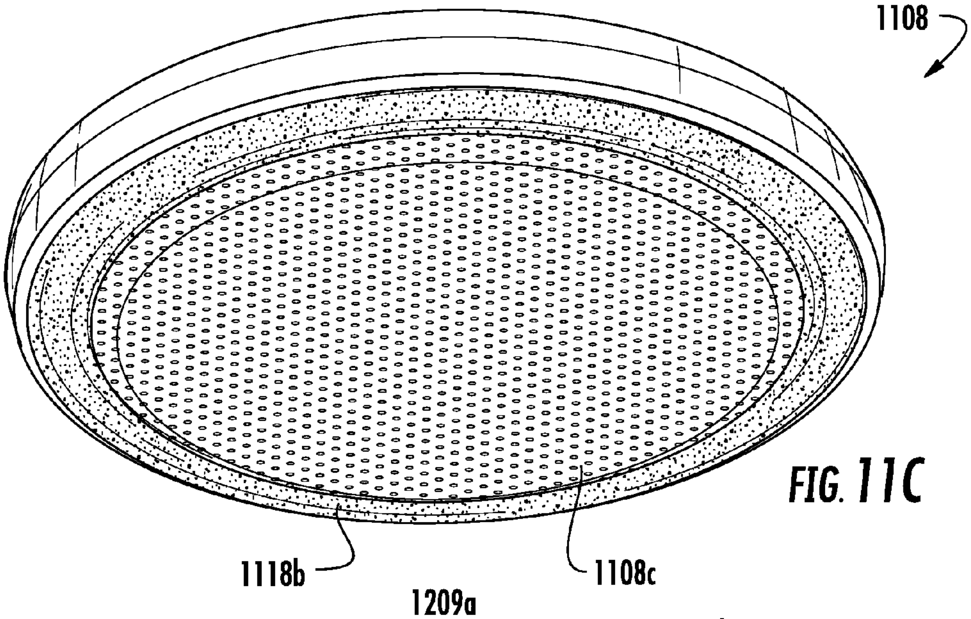

FIGS. 11A-11C illustrate another implementation of a fan assembly. In a manner similar to FIGS. 2A-2C, 3A-3D, and 4A-4C, items that are similar to those previously discussed in this document will be referenced using the same last two-digit number, but using the prefix "11." Thus, in FIGS. 11A-11C, the fan assembly is referred to generally by reference numeral 1100. FIGS. 11A-11C further depict an exterior side view of the fan assembly 1100, and comprising a grille 1108 (otherwise referred to as grille assembly 1108). As such, grille 1108 may be similar to grille 108 from FIGS. 1A-1D. As depicted in FIG. 11A, grille 108 may be configured to be coupled to a housing 1102, similar to housing 102 from FIGS. 1A-1D. In turn, housing 1102 may comprise an outlet 1102*b* (similar to outlet 102*b*), and an interface 1120 configured to facilitate power and signal (data) transfer/communication between the fan assembly 1100 and one or more control devices (described in further detail in relation to FIGS. 13, 14, and 15). The grille 1108 is configured with a plurality of openings 1108*c*. As such, openings 1108*c* may be configured to allow air to pass into the housing 1102 for extraction by a fan (not depicted in FIGS. 11A-11C, but may be similar to fan 106), and out through outlet 1102*b*. Additionally or alternatively, openings 1108*c* may be configured to output sound from one or more speakers (not depicted in FIGS. 11A-11C, but described in relation to FIG. 12). In one implementation, and as depicted in FIGS. 11A-11C, openings 1108*c* may have circular shapes. However, those of ordinary skill in the art will recognize that the openings 1108*c* may comprise any shape, or combinations of shapes, and be implemented with any size (dimensions), or with varying sizes, and the like. Further, openings 1108*c* may be implemented with any configuration/pattern, without departing from the scope of the disclosures described herein. For example, openings 1108*c* may be embodied with a linear pattern, a spiral pattern, or a circular pattern, among others. In one example, one or more portions of the openings 1108*c* may have a first configuration for reducing an amount of noise from a fan, such as fan 106. Additionally, one or more portions of the openings 1108*c* may have a second configuration configured to emit sound from one or more speakers (described in relation to FIG. 12).

In one example, grille 1108 may have an outer annular wall 1108*f* and an annular lighting ring 1118, otherwise referred to as an annular lighting array 1118. As such, the annular lighting ring 1118 may be configured with a transparent, or partially-transparent, screen configured to facilitate emission of light from one or more internal light sources (not pictured in FIGS. 11A-11C). Accordingly, the annular lighting ring 1118 may be configured with an annular array of internal light sources. In one example, the annular lighting ring 1118 may comprise one or more light-emitting diode (LED) light sources. In another example, the annular lighting ring 1118 may comprise one or more fluorescent, or incandescent light sources, or any other light source technology known to those of ordinary skill in the art, or combinations thereof. Further, those of ordinary skill in the art will recognize that the annular lighting ring 1118 may comprise any number of light sources, without departing from the disclosures described herein.

In one example, the annular lighting ring 1118 may comprise a first plurality of light-emitting diode light sources having a first color temperature, hue, and/or color. In one example, the first color temperature may have a value between 1400 and 8000 K. In another example, the first color temperature may have a value between 2000 and 4500 K., and the like As such, this first color temperature may correspond to a "white," "daylight," or "high power" lighting configuration. In this way, the first color temperature may be utilized when a user desires full illumination of an area covered by (within an area of illumination of) the annular lighting ring 1118. In one specific example, this area covered by the annular lighting ring 1118 may be an area of a bathroom, or kitchen space, and the like. In another example, the annular lighting ring 1118 may comprise a second plurality of light-emitting diode light sources having a second color temperature/hue/color configuration. Accordingly, the second color configuration may correspond to the second plurality of light-emitting diode light sources having lower power consumption ratings. As such, this second color configuration may correspond to a low power configuration of the annular lighting ring 1118. In one specific example, the second plurality of light-emitting diode light sources having a lower power consumption rating may correspond to a blue lighting configuration. Those of ordinary skill in the art will recognize that a blue color configuration of light-emitting diodes may be associated with lower power consumption than a white light-emitting diode configuration. Those of ordinary skill in the art will further recognize that the relative terms "white" color configuration and "blue" color configuration are utilized herein as exemplary descriptors, and that the annular lighting ring 1118 may be configured to emit light with different color temperatures/cues/colors to those suggested by the terms "white" and "blue." As such, light emitted from the annular lighting ring 1118 may alternatively be described as having a relatively high-power first configuration emitting "white"/"yellow"/bright light (said first configuration schematically depicted by that shaded region 1118*a* from FIG. 11B), and a relatively low-power second configuration emitting "blue"/"cool"/darker/dim light (said second configuration schematically depicted by the shaded region 1118*b* from FIG. 11C), and the like. Accordingly, the annular lighting ring 1118 may be configured with a first plurality of white LEDs (high power/bright) and a second plurality of blue LEDs (low power/dimmer).

Those of ordinary skill in the art will further recognize, however, that the annular lighting ring 1118 may be configured with additional or alternatively-colored LEDs, without departing from the scope of the disclosures described herein. Furthermore, the first plurality and the second plurality of LEDs may each comprise any number of LEDs, without departing from the scope of the disclosures described herein. Additionally or alternatively, the annular lighting ring 1118 may comprise a plurality of LEDs configured to emit light with a first color (bright, high-power configuration) and selectively emit light with a second color (low-power, blue light), and the light. In this way, a single LED element may be configured to change color temperature, hue, and/or color output upon selection by a user, and the like. Further, those of ordinary skill in the art will recognize that LEDs, or other light source technologies, utilized within the annular lighting ring 1118 may be configured with any power rating, lighting intensity, and/or luminous flux, without departing from the scope of the disclosures described herein.

Advantageously, the annular lighting ring 1118 of fan assembly 1100 may reduce power consumption by the fan assembly 1100 when configured to operate in a "nightlight" configuration with the annular lighting ring 1118 emitting blue light. Additionally or alternatively, the light emitted from the annular lighting ring 1118 may be described as a "soothing" blue nightlight, and may be configured to allow a user to see various objects within an illuminated space (e.g. the bathroom area) without requiring a user adjust his/her eyesight to bright light (such as that adjustment to bright light upon awakening from sleep, and the like).

Additionally or alternatively, one or more light sources (e.g. LED light sources) of the annular lighting ring 1118 may be similar to LEDs 407*b* described in relation to FIG. 4A-4C.

Figure 12:
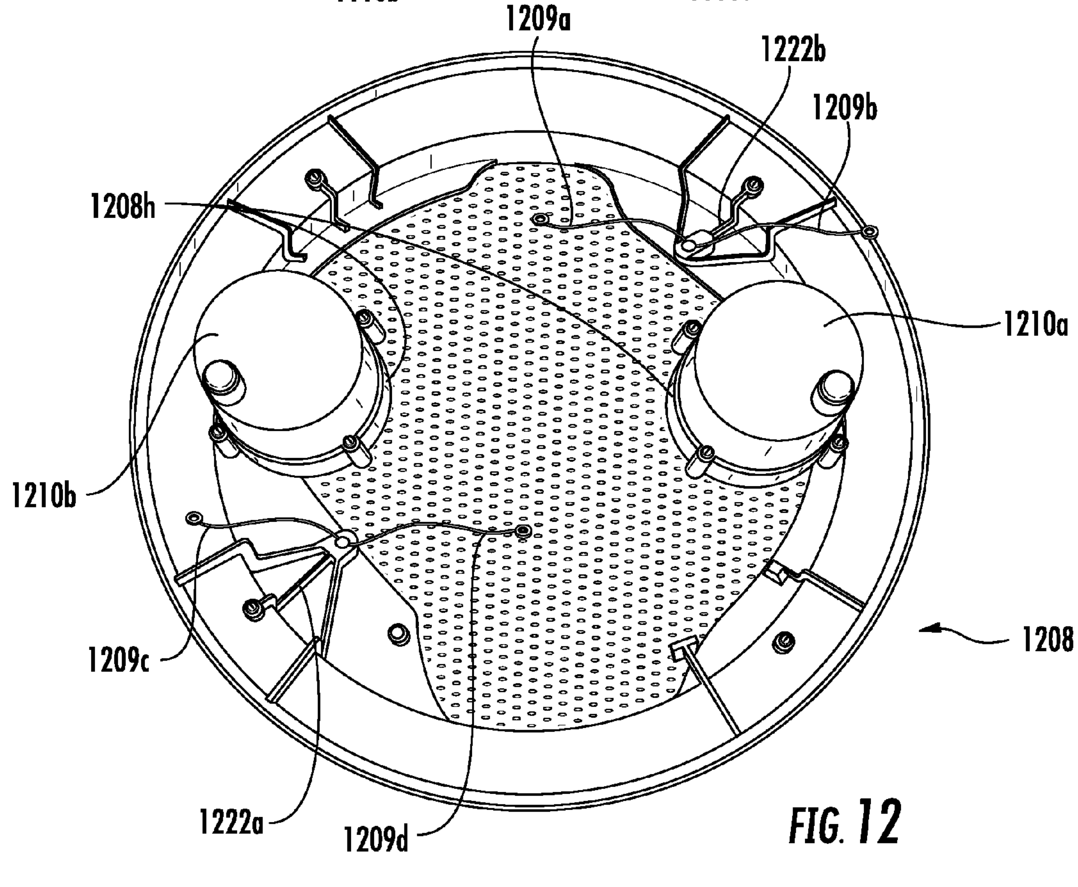
FIG. 12 illustrates a backside/interior view of another exemplary implementation of another embodiment, similar to the embodiment from FIGS. 11A-11C.

FIG. 12 illustrates a backside/interior view of another exemplary implementation of a grille 1208, similar to grille 1108 from FIGS. 11A-11C. In a similar manner to FIGS. 11A-11C, and for purposes of convenience, items that are similar to those discussed above with respect to FIGS. 11A-11C, as well as those figures preceding FIGS. 11A-11C, are referenced using the same last two-digit number, but using the prefix "12."

Accordingly, grille 1208 is configured to receive a first speaker 1210*a* and a second speaker 1210*b* (otherwise referred to as speaker assemblies 1210*a* and 1210*b*), thereby facilitating stereo sound emission through those openings 1108*c* described in relation to FIGS. 11A-11C. Further, speakers 1210*a* and 1210*b* may be similar to speaker 210 described in relation to FIGS. 2A-2C. As such, speakers 1210*a* and 1210*b* may be configured to be used in a humid/damp environment (such as a humid environment associated with a bathroom, and the like). Furthermore, speakers 1210*a* and 1210*b* may be connected to a mains power outlet (not shown). Additionally or alternatively, speakers 1210*a* and 1210*b* may receive data to be transduced into an audio output via a Bluetooth network connection. Additionally or alternatively, speakers 1210*a* and 1210*b* may receive data via one or more alternative network connection types (the various network connectivity types described in further detail in relation to FIG. 15).

Those of ordinary skill in the art will recognize that grille 1208 may alternatively be configured with a single speaker device, or three or more speaker devices similar to those speakers 1210*a* and 1210*b*. Furthermore, those of ordinary skill in the art will recognize that the relative positioning of speakers 1210*a* and 1210*b* may differ from that depicted in FIG. 12, without departing from the scope of the disclosures described herein. In one example, a single speaker element 1210*a* or 1210*b* includes hardware to output one or more audio signals with both high frequencies (tweeter hardware) and low frequencies (woofer hardware). Additionally or alternatively, a first speaker element 1210*a* may be configured to output a portion of an audio signal corresponding to high audio frequencies, while a second speaker element 1210*b* may be configured to output a portion of the audio signal corresponding to low audio frequencies, and the like.

In one implementation, speakers 1210*a* and 1210*b* are coupled to grille structure 1208 by mounts 1208*h*, wherein mounts 1208*h* comprise a bracket structure configured to receive one or more fasteners (screws, and the like) to rigidly couple each of the speakers 1210*a* and 1210*b* to the grille 1208. Additionally, grille 1208 may comprise one or more support ribs 1222*a* and 1222*b* configured to provide a rigid mounting point for coupling grille 1208 to the housing assembly, such as housing 1108 from FIG. 11A. In this way, grille 1208 may be coupled to a housing, such as housing 1102, by one or more fasteners, such as fasteners 1209*a*-1209*d*, wherein fasteners 1209*a*-1209*d* may be spring fastener similar to springs 209 from FIGS. 2A-2C.

In another implementation, grille 1208 may comprise a microphone sensor and associated circuitry (ASIC, FPGA, and the like) configured to detect ambient noise from a fan, such as a fan associated with the assembly 1100. As such, this microphone sensor and associated circuitry may be configured to generate for output via speakers 1210*a* and 1210*b*, a destructively-interfering sound wave (noise cancelling sound wave) such that the detected fan noise may be partially or wholly cancelled out by destructive interference.

Figure 13:
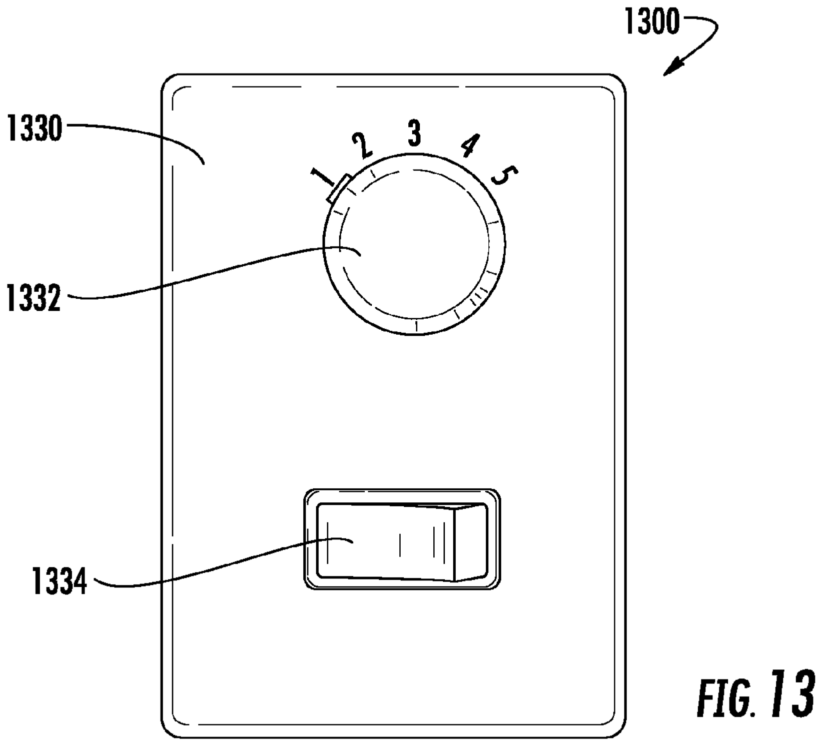
FIG. 13 schematically depicts a wall control panel in accordance with another embodiment.

FIG. 13 schematically depicts a wall control panel 1300. In particular, the wall control panel 1300 may be utilized to input one or more signals to a fan assembly, such as assembly 1100 from FIGS. 11A-11C. As such, the wall control panel 1300 may be affixed to a surface (a wall, a shelf, or any other surface), and configured to receive one or more inputs from a human user. In that implementation depicted in FIG. 13, the wall control panel 1300 comprises a back plate 1330, a first input interface 1332 (a knob input), and a second input interface 1334 (a switch input interface). Accordingly, those of ordinary skill in the art will recognize that the interface 1332 may be adjusted between a plurality of different set point values corresponding to a plurality of controls for the light and other functions of the assembly 1100. For example, as depicted in FIG. 13, the wall control panel 1300 may have settings 1-5 for the interface 1332. Setting 1 may control a blue light night-light/low illumination configuration for the annular lighting ring 1118. Setting 2 may control a white light fully lit/high illumination configuration for the annular lighting ring 1118. Setting 3 may control a white light fully lit/high illumination configuration for the annular lighting ring 1118 and turning on or off the fan. Setting 4 may control a white light fully lit/high illumination configuration for the annular lighting ring 1118, turning on or off the fan, and an audio output via a Bluetooth network connection. Setting 5 may control turning on or off the fan and an audio output via a Bluetooth network connection. Other setting and control combinations may be utilized without departing from this invention. Those of ordinary skill in the art will recognize that the wall control panel 1300 may comprise input interfaces (control switches, knobs, pull strings, sensors, and the like) in addition to those depicted in FIG. 13 and described above, and without departing from the scope of the disclosures described herein.

Additionally or alternatively, interface 1332 may be actuated by depressing the knob structure to toggle the light between a powered-on configuration and a powered-off configuration, and the like. Furthermore, interface 1334 may be configured to control a lighting configuration of the annular lighting ring 1118 described in relation to FIG. 11A. As such, switch 1334 may be a two-position switch configured to toggle between a powered-on configuration corresponding to the annular lighting ring 1118 being in a fully lit/high illumination configuration, and a nightlight/low illumination configuration. Alternatively, switch 1334 may be configured as a three-position switch, and configured to toggle between a high illumination configuration, a nightlight configuration, and a powered-off configuration of annular lighting ring 1118.

In another implementation, interface 1332 may be actuated by rotating the knob in a clockwise/counterclockwise direction to control a speed of a fan associated with a fan assembly, such as fan assembly 1100 from FIG. 11A. Accordingly, those of ordinary skill in the art will recognize that the interface 1332 may be adjusted between a plurality of different set point values corresponding to a plurality of different fan speeds/powers ranging from a position corresponding to the fan being powered off to a position corresponding to a maximum permissible fan speed. Furthermore, the wall control panel 1300 may be configured to be in communication with a fan assembly, such as fan assembly 1100, by direct wiring of mains power to/from the fan assembly 1100 through the wall control panel 1300. In this way, the interfaces 1332 and/or 1334 may control the operation of one or more of an extractor fan (such as fan 106 from FIG. 1C) and/or the annular lighting ring 1118 by opening/closing an electrical circuit and/or controlling the voltage/current to the fan assembly 1100. In another implementation, interfaces 1332 and/or 1334 may represent relays configured to isolate the physical interfaces from the electrical supply circuit. In yet another implementation, wall control panel 1300 may be configured to transmit/receive analog and/or digital signals that may be communicated to a fan assembly, such that assembly 1100. As such, these analog and/or digital signals may be communicated to the fan assembly 1100 through a wired or wireless network, and as described in further detail in relation to FIG. 15.

Those of ordinary skill in the art will recognize that wall control panel 1300 may be configured with features in addition to those described previously. For example, wall control panel 1300 may comprise one or more LEDs (or other light source technologies) configured to illuminate part or all of the control interfaces 1332 and/or 1334 such that they are visible in an otherwise darkened room, and the like. Furthermore, the wall control panel 1300 may be configured with various gaskets, electrical isolation features, and the like, configured to ensure that moisture (such as humid air in a bathroom and/or a wet hand of a user interacting with the panel 1300) does not affect the operation of the wall control panel 1300.

Figure 14:
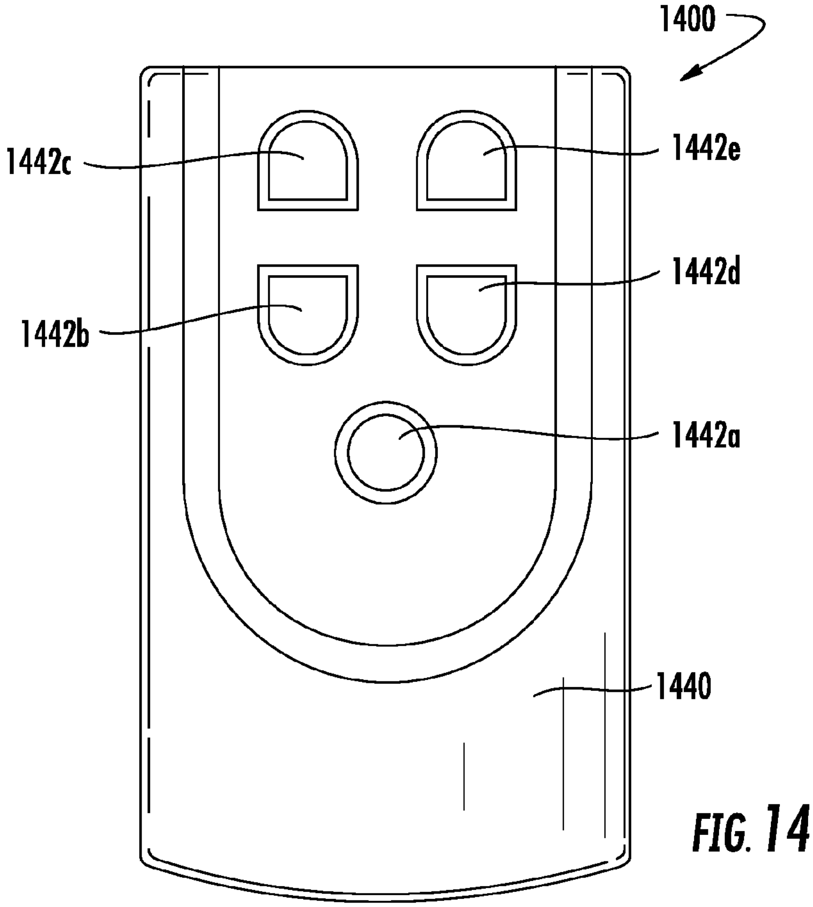
FIG. 14 schematically depicts one implementation of a remote control device in accordance with another embodiment.

FIG. 14 schematically depicts one implementation of a remote control device 1400. In one example, the remote control device 1400 may be utilized to control one or more functions of those speakers 1210*a* and 1210*b* described in relation to FIG. 12. In one example, the remote control device 1400 comprises a housing 1440, and user interfaces 1442*a*-1442*e*. In a further example, the user interfaces may comprise a "pause/play" button 1442*a*, "volume up/down" buttons 1442*b* and 1442*c*, and "forward/backward" buttons 1442*d* and 1442*e*, and the like. Those of ordinary skill in the art will recognize, however, that the remote control device 1400 may be embodied with any combination of user input interfaces, such as interfaces 1442*a*-1442*e*. As described herein, the user input interfaces 1442*a*-1442*e* may be actuated by a user to control one or more functions of a device connected to the speakers 1210*a* and 1210*b* from FIG. 12. As such, the user input interfaces 1442*a*-1442*e* may communicate with a connected smart phone, tablet, laptop or desktop computer, or another audio device connected to speakers 1210*a*-1210*b*.

The remote control device 1400 may be configured such that communication between device 1400 and the fan assembly 1100 is facilitated by an infrared connection, a Bluetooth connection, a Wi-Fi connection, an RF connection, or a wired connection, among others. Furthermore, the remote control device 1400 may be configured with a water resistant/waterproof structure such that it may be interacted with in a wet environment (may be utilized in a shower/bath, and the like). Additionally, the remote control device 1400 may comprise a suction cup structure on a back surface (not pictured) such that it may be temporarily affixed to a smooth surface (glass, stone, ceramic, metal, and the like).

Figure 15:
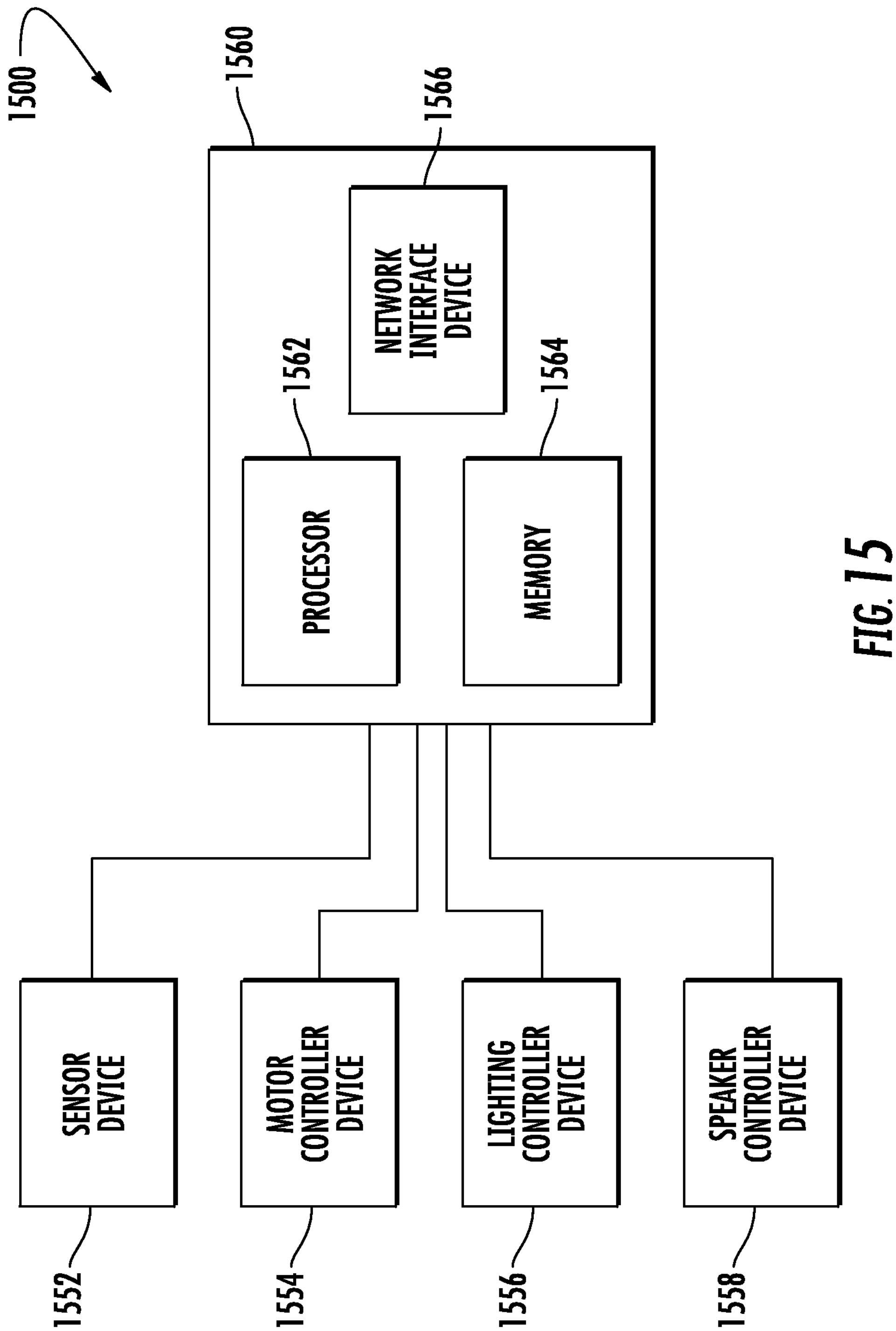
FIG. 15 is a schematic block diagram of a smart fan device in accordance with another embodiment.

FIG. 15 is a schematic block diagram of a smart fan device 1500. As such, the following describes various features that may be utilized with a fan assembly, such as fan assembly 1100, to implement one or more advanced control options. In particular, the smart fan device 1500 comprises a sensor device 1552, a motor controller device 1554, a lighting controller device 1556, a speaker controller device 1558, a computer device 1560 further comprising a processor 1562, a memory 1564, and a network interface device 1566.

In one implementation, sensor device 1552 may represent one or more sensors that may be utilized with a fan assembly, such as fan assembly 1100 from FIG. 11. In this way, sensor device 1552 may represent a motion sensor configured to detect a motion of a user in an area of a living space (e.g. motion of a user in a bathroom in which a fan assembly 1100 is installed). As such, the smart fan device 1500 may be configured to receive a signal from a sensor device 1552, and in response, power on one or more of a fan (such as fan 106), the annular lighting ring 1118, or the speakers 1210*a* and 1210*b* upon detection of motion. In another example, the smart fan device 1500 may be configured to power-off on one or more of a fan (such as fan 106), the annular lighting ring 1118, or the speakers 1210*a* and 1210*b*, or switch the annular lighting ring 1118 to a low power (nightlight) configuration, when motion has not been detected for a predetermined threshold amount of time (timeout period).

In another example, sensor device 1552 may comprise a humidity sensor configured to detect a level of relative humidity within a room (e.g. within a bathroom). As such, the smart fan device 1500 may be configured to receive a signal indicative of a humidity level, and in response, power on, or increase a fan speed, of a fan associated with the fan assembly 1100 upon detection of a humidity level above one or more threshold levels.

In another example, sensor device 1552 may be a microphone sensor, and may be configured to output a signal to be received by a computer device 1560. In response, the computer device 1560 may be configured to dynamically adjust a volume of speakers 1210*a* and 1210*b* based upon a level of ambient noise detected within a room associated with fan assembly 1100. In another example, the microphone sensor may be configured to detect noise generated by the operation of the fan assembly 1100, and in response, the computer device 1560 may be configured to generate for output via speakers 1210*a* and 1210*b*, a sound wave configured to destructively interfere (partial or whole noise cancellation) with the detected fan noise wave.

In yet another example, sensor device 1552 may be an ambient light sensor, and may be configured to output a signal indicative of an ambient light level within a space associated with the fan assembly 1100. Upon receiving the signal output from the ambient light sensor, the computer device 1560 may be configured to automatically activate the annular light ring 1118 upon detection of an ambient lighting level dropping below one or more predetermined threshold levels.

In one implementation, the motor controller device 1554 may comprise circuitry configured to control a speed of operation of an AC and/or DC motor, such as that motor 104 associated with fan 106 from FIG. 1C. As such, the motor controller device 1554 may be configured to receive an analog or a digital signal from a computer device, such as computer device 1560. In response to receiving a signal from computer device 1560, the motor controller device 1554 may be configured to start, stop, or adjust a speed of the motor controlling a fan speed.

In another implementation, the lighting controller device 1556 may be configured to receive a signal from computer device 1560 to activate, adjust a lighting intensity level, or power off, one or more light sources associated with a fan assembly, such as those light sources associated with the annular lighting ring 1118.

In yet another implementation, the speaker controller device 1558 may be configured to communicate a data signal from computer device 1560 to speakers 1210*a* and 1210*b* to be transduced into an audible signal outputted through openings 1108*c*.

As previously described, the sensor device 1552, motor controller device 1554, lighting controller device 1556, and/or speaker controller device 1558 may be connected to a computer device 1560. This connection may be one or more of a wired, or wireless connection, and may utilize any communication configuration known to those of ordinary skill in the art, including, among others, any technology associated with the OSI model physical layer (layer 1), and including, among others, Ethernet, USB, Optical wire, Bluetooth, IEEE 1394 interface, IRDA, or combinations thereof.

Computer device 1516 may be configured as a general-purpose, or a special-purpose device. As such, computer device 1560 may comprise a processor 1562 having one or more processing cores, and a memory 1564, which may be a form of volatile, or a non-volatile form of memory (including, among many others, RAM, ROM, a HDD, a SSD, optical disk, or combinations thereof). Additionally, computer device 1560 may comprise a network interface device 1566 configured with hardware, firmware, and software to facilitate communication via one or more network types. In this way, network interface device 1566 may be configured to facilitate communication between computer device 1560 and another external device (not pictured) using one or more of Ethernet, Bluetooth, Wi-Fi, a cellular network, an infrared connection, satellite communication, or combinations thereof. As such, the smart fan device 1500 may communicate with one or more of the wall control panel 1300 and/or the remote control device 1400 in order to control one or more functions of the fan assembly 1100 from FIG. 11A. Additionally or alternatively, the smart fan device 1500 may allow a user to monitor, record data, and/or control various functions of a fan assembly 1100, by communication between a smart phone, a tablet, a laptop or desktop computer, or another device via one or more of the Internet, a LAN, or a WAN, among others.

The various embodiments described herein may be implemented by general-purpose or specialized computer hardware. In one example, the computer hardware may comprise one or more processors, otherwise referred to as microprocessors, having one or more processing cores configured to allow for parallel processing/execution of instructions. As such, the various disclosures described herein may be implemented as software coding, wherein those of skill in the computer arts will recognize various coding languages that may be employed with the disclosures described herein. Additionally, the disclosures described herein may be utilized in the implementation of application-specific integrated circuits (ASICs), or in the implementation of various electronic components comprising conventional electronic circuits (otherwise referred to as off-the-shelf components). Furthermore, those of ordinary skill in the art will understand that the various descriptions included in this disclosure may be implemented as data signals communicated using a variety of different technologies and processes. For example, the descriptions of the various disclosures described herein may be understood as comprising one or more streams of data signals, data instructions, or requests, and physically communicated as bits or symbols represented by differing voltage levels, currents, electromagnetic waves, magnetic fields, optical fields, or combinations thereof.

One or more of the disclosures described herein may comprise a computer program product having computer-readable medium/media with instructions stored thereon/therein that, when executed by a processor, are configured to perform one or more methods, techniques, systems, or embodiments described herein. As such, the instructions stored on the computer-readable media may comprise actions to be executed for performing various steps of the methods, techniques, systems, or embodiments described herein. Furthermore, the computer-readable medium/media may comprise a storage medium with instructions configured to be processed by a computing device, and specifically a processor associated with a computing device. As such the computer-readable medium may include a form of persistent or volatile memory such as a hard disk drive (HDD), a solid state drive (SSD), an optical disk (CD-ROMs, DVDs), tape drives, floppy disk, ROM, RAM, EPROM, EEPROM, DRAM, VRAM, flash memory, RAID devices, remote data storage (cloud storage, and the like), or any other media type or storage device suitable for storing data thereon/therein. Additionally, combinations of different storage media types may be implemented into a hybrid storage device. In one implementation, a first storage medium may be prioritized over a second storage medium, such that different workloads may be implemented by storage media of different priorities.

Further, the computer-readable media may store software code/instructions configured to control one or more of a general-purpose, or a specialized computer. Said software may be utilized to facilitate interface between a human user and a computing device, and wherein said software may include device drivers, operating systems, and applications. As such, the computer-readable media may store software code/instructions configured to perform one or more implementations described herein.

Those of ordinary skill in the art will understand that the various illustrative logical blocks, modules, circuits, techniques, or method steps of those implementations described herein may be implemented as electronic hardware devices, computer software, or combinations thereof. As such, various illustrative modules/components have been described throughout this disclosure in terms of general functionality, wherein one of ordinary skill in the art will understand that the described disclosures may be implemented as hardware, software, or combinations of both.

The one or more implementations described throughout this disclosure may utilize logical blocks, modules, and circuits that may be implemented or performed with a general-purpose processor, a digital signal processor (DSP), an application-specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, or any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The techniques or steps of a method described in connection with the embodiments disclosed herein may be embodied directly in hardware, in software executed by a processor, or in a combination of the two. In some embodiments, any software module, software layer, or thread described herein may comprise an engine comprising firmware or software and hardware configured to perform embodiments described herein. Functions of a software module or software layer described herein may be embodied directly in hardware, or embodied as software executed by a processor, or embodied as a combination of the two. A software module may reside in RAM memory, flash memory, ROM memory, EPROM memory, EEPROM memory, registers, hard disk, a removable disk, a CD-ROM, or any other form of storage medium known in the art. An example storage medium is coupled to the processor such that the processor can read data from, and write data to, the storage medium. In the alternative, the storage medium may be integral to the processor. The processor and the storage medium may reside in an ASIC. The ASIC may reside in a user device. In the alternative, the processor and the storage medium may reside as discrete components in a user device.

It should be understood that in certain embodiments different types of quick connect/quick disconnect connectors may be used. Insulation displacement connectors (or insulation piercing connectors or the like) may be used to allow the speaker and/or lighting to be quickly connected to existing wiring and/or wiring that is not set up with quick connect/quick disconnect terminals or connectors. Such insulation displacement connectors can be particularly helpful in retrofit applications where the speaker and/or light are being connected to an existing fan housing that does not have quick connect/quick disconnect connectors and/or may not even have a power outlet (such as, for example, if the fan grille being replaced did not have a light or an accompanying power outlet for a light).

Changes may be made to the embodiments disclosed herein while still operating within the concepts contemplated. For example, parts of different size, shape, location or number may be used, and/or various parts of one embodiment may be combined with other embodiments. For example, although some embodiments discussed herein mention using a sleeve configuration for mounting the speaker to the grille, it should be understood that in alternate embodiments any number of mating structures and fasteners may be used as is desired for a particular application. Similarly, in alternate embodiments different opening sizes, shapes and patterns may be used for the grille and/or grilles of different sizes and shapes may be used.

In addition to such apparatus, methods are also disclosed herein. For example, methods of maintaining pairing between a speaker and a paired electronic device are disclosed herein. Similarly, methods of maintaining continuous audio operation of a device speaker while the device is switched between two or more modes of operation are also disclosed herein. Methods of manufacturing and/or assembling an audio equipped fan assembly are disclosed herein, as are methods of installing and/or operating such audio equipped fans. Methods of operating a Bluetooth speaker and an audio equipped fan are similarly disclosed herein.

Those skilled in the art will recognize that a wide variety of modifications, alterations, and combinations can be made with respect to the above described embodiments without departing from the scope of the invention, and that such modifications, alterations, and combinations are to be viewed as being within the ambit of the inventive concepts disclosed herein.

What is claimed is:

1. A fan assembly comprising:

a housing having a motor coupled to an impeller;

a grille assembly, removably-coupled to an inlet of the housing, the grille assembly further comprising:

a plurality of openings, wherein a first area of the plurality of openings is configured to allow air to pass through to the impeller;

a pair of speakers, coupled to an interior side of the grille, and configured to output stereo sound through a second area of the plurality of openings; and an annular lighting array, configured to selectively emit light in a low power configuration and a high power configuration.

2. The fan assembly of claim 1, wherein the low power configuration comprises a blue nightlight configuration.

3. The fan assembly of claim 1, wherein the high power configuration comprises emission of light with a color temperature ranging from 2000 to 4500 K.

4. The fan assembly of claim 1, wherein the annular lighting array further comprises a plurality of LED light sources.

5. The fan assembly of claim 1, wherein the pair of speakers further comprise a wireless connection to an external audio signal source.

6. The fan assembly of claim 1, further comprising a sensor device, configured to detect ambient noise.

7. The fan assembly of claim 1, further comprising a computer device, configured to control one or more of a fan speed and a lighting level based upon instructions received from an Internet connection.

8. The fan assembly of claim 1, wherein the first area of the plurality of openings is configured to reduce audible noise from the impeller.

9. A fan assembly supported on a ceiling, comprising:

a housing having an air inlet, an air outlet, and an interior positioned between the inlet and outlet;

a motor and a fan driven by the motor, the fan being supported in the interior of the housing and being operable to move air from a room;

a grille connected to the housing and extending across the air inlet of the housing, having an interior side and an exterior side and defining a plurality of first openings through which air may flow while the fan is on and a plurality of second openings through which sound may travel;

a pair of speakers in the interior of the housing and aligned with the second openings to output sound there through;

an annular lighting array, configured to selectively emit light in a low power configuration and a high power configuration; and a remote control interface, configured to control operation of the motor, the pair of speakers, and the annular lighting array.

10. The fan assembly of claim 9, wherein the remote control interface further comprises a wired connection to the housing.

11. The fan assembly of claim 9, wherein the remote control interface comprises a wireless connection to the housing.

12. The fan assembly of claim 11, wherein the wireless connection is an infrared connection.

13. The fan assembly of claim 11, wherein the wireless connection is a radio frequency connection.

14. The fan assembly of claim 11, wherein the wireless connection is a Wi-Fi connection.

15. The fan assembly of claim 9, wherein the remote control interface comprises a waterproof construction.

16. The fan assembly of claim 9, further comprising a microphone sensor configured to adjust a volume of the pair of speakers based upon a detected ambient noise level.

17. The fan assembly of claim 9, wherein the low power configuration comprises blue light emitted by a plurality of LEDs.

18. A fan assembly, comprising:

a housing having an air inlet, an air outlet, and an interior positioned between the inlet and outlet;

a motor and a fan driven by the motor, the fan being supported in the interior of the housing and being operable to move air from a room;

a grille connected to the housing and extending across the air inlet of the housing, having an interior side and an exterior side and defining a plurality of first openings through which air may flow while the fan is on and a plurality of second openings through which sound may travel;

a pair of speakers in the interior of the housing;

an annular lighting array, selectively adjustable between a low power configuration and a high power configuration; and a microphone sensor, configured to detect a fan noise in the housing, and further configured to output a destructively interfering sound wave from the pair of speakers configured to cancel at least a portion of the detected fan noise.

19. The fan assembly of claim 18, wherein the annular lighting array further comprises a plurality of color-changing LEDs.

20. The fan assembly of claim 19, wherein the low power configuration comprises a blue light emitted from a plurality of LEDs.

* * * * *